(12) United States Patent
Kawashima et al.

(10) Patent No.: US 8,785,238 B2
(45) Date of Patent: Jul. 22, 2014

(54) NONVOLATILE MEMORY ELEMENT AND METHOD FOR MANUFACTURING SAME

(75) Inventors: Yoshio Kawashima, Okaka (JP); Takumi Mikawa, Shiga (JP)

(73) Assignee: Panasonic Corporation, Osaka (JP)

( * ) Notice: Subject to any disclaimer, the term of this patent is extended or adjusted under 35 U.S.C. 154(b) by 29 days.

(21) Appl. No.: 13/704,663

(22) PCT Filed: Jun. 30, 2011

(86) PCT No.: PCT/JP2011/003745
§ 371 (c)(1),
(2), (4) Date: Dec. 17, 2012

(87) PCT Pub. No.: WO2012/001978
PCT Pub. Date: Jan. 5, 2012

(65) Prior Publication Data
US 2013/0092893 A1 Apr. 18, 2013

(30) Foreign Application Priority Data
Jul. 1, 2010 (JP) ................................. 2010-150717

(51) Int. Cl.
*H01L 29/02* (2006.01)
(52) U.S. Cl.
USPC ............. 438/102; 438/103; 438/104; 257/2; 257/3; 257/4; 257/5; 257/E29.002
(58) Field of Classification Search
USPC ................... 257/1–5, E29.002; 438/102–104
See application file for complete search history.

(56) References Cited

U.S. PATENT DOCUMENTS

| 6,303,486 | B1 | 10/2001 | Park |
| 6,362,027 | B1 | 3/2002 | Yamazaki et al. |
| 6,396,147 | B1 | 5/2002 | Adachi et al. |
| 6,794,279 | B1 | 9/2004 | Stephen et al. |
| 6,952,030 | B2 | 10/2005 | Herner et al. |
| 6,960,495 | B2 | 11/2005 | Vyvoda et al. |
| 6,984,561 | B2 | 1/2006 | Herner et al. |

(Continued)

FOREIGN PATENT DOCUMENTS

| JP | 61-270823 | 12/1986 |
| JP | 05-182890 | 7/1993 |

(Continued)

OTHER PUBLICATIONS

International Search Report issued Oct. 4, 2011 in International (PCT) Application No. PCT/JP2011/003745.

(Continued)

*Primary Examiner* — Jami M Valentine
(74) *Attorney, Agent, or Firm* — Wenderoth, Lind & Ponack, LLP.

(57) ABSTRACT

The method includes: forming a lower electrode layer above a substrate; forming a variable resistance layer on the lower electrode layer; forming an upper electrode layer on the variable resistance layer; forming a hard mask layer on the upper electrode layer; forming a photoresist mask on the hard mask layer; forming a hard mask by performing etching on the hard mask layer using the photoresist mask; and forming a nonvolatile memory element by performing etching on the upper electrode layer, the variable resistance layer, and the lower electrode layer, using the hard mask. In the forming of a photoresist mask, the photoresist mask is formed to have corner portions which recede toward the center portion in planar view.

13 Claims, 15 Drawing Sheets

(56) References Cited

U.S. PATENT DOCUMENTS

| | | |
|---|---|---|
| 6,995,442 B2 | 2/2006 | Herner et al. |
| 7,009,275 B2 | 3/2006 | Herner et al. |
| 7,026,212 B2 | 4/2006 | Herner et al. |
| 7,417,271 B2 | 8/2008 | Genrikh et al. |
| 7,981,760 B2 | 7/2011 | Kawashima et al. |
| 8,022,502 B2 | 9/2011 | Kanzawa et al. |
| 2005/0012119 A1 | 1/2005 | Herner et al. |
| 2005/0012120 A1 | 1/2005 | Herner et al. |
| 2005/0012154 A1 | 1/2005 | Herner et al. |
| 2005/0012220 A1 | 1/2005 | Vyvoda et al. |
| 2005/0014322 A1 | 1/2005 | Herner et al. |
| 2005/0014334 A1 | 1/2005 | Herner et al. |
| 2007/0132049 A1 | 6/2007 | Stipe |
| 2007/0200158 A1 | 8/2007 | Genrikh et al. |
| 2008/0199975 A1 | 8/2008 | Park et al. |
| 2008/0304308 A1 | 12/2008 | Stipe |
| 2009/0224224 A1 | 9/2009 | Fujii et al. |
| 2009/0283736 A1* | 11/2009 | Kanzawa et al. .................. 257/2 |
| 2010/0190313 A1 | 7/2010 | Kawashima et al. |
| 2011/0205783 A1 | 8/2011 | Murooka |
| 2011/0294259 A1* | 12/2011 | Kanzawa et al. ............. 438/104 |
| 2012/0252184 A1* | 10/2012 | Ninomiya et al. ............ 438/382 |

FOREIGN PATENT DOCUMENTS

| | | |
|---|---|---|
| JP | 07-161601 | 6/1995 |
| JP | 11-330486 | 11/1999 |
| JP | 2000-049354 | 2/2000 |
| JP | 2003-521123 | 7/2003 |
| JP | 2003-534658 | 11/2003 |
| JP | 2007-165873 | 6/2007 |
| JP | 2007-235139 | 9/2007 |
| JP | 2008-199030 | 8/2008 |
| JP | 2008-244397 | 10/2008 |
| JP | 2009-004725 | 1/2009 |
| JP | 2010-009669 | 1/2010 |
| JP | 2010-040728 | 2/2010 |
| WO | 01/56077 | 8/2001 |
| WO | 01/91168 | 11/2001 |
| WO | 2004/061851 | 7/2004 |
| WO | 2008/059701 | 5/2008 |
| WO | 2008-149484 | 12/2008 |
| WO | 2009-050861 | 4/2009 |
| WO | 2009/136493 | 11/2009 |
| WO | 2011-074243 | 6/2011 |

OTHER PUBLICATIONS

Fumiyoshi Takano et al., "Reactive Ion Etching Process of Transition-Metal Oxide for Resistance Random Access Memory Device", Japanese Journal of Applied Physics, vol. 47, No. 8, pp. 6931-6933, Aug. 22, 2008.

* cited by examiner

NONVOLATILE MEMORY ELEMENT AND METHOD FOR MANUFACTURING SAME

TECHNICAL FIELD

The present invention relates to a variable resistance nonvolatile memory element and a method of manufacturing the same.

BACKGROUND ART

In recent years, a variable resistance nonvolatile memory element has been proposed which includes, as a memory material, a variable resistance material comprising a transition metal oxide which includes less oxygen (non-stoichiometric) than a transition metal oxide having a stoichiometric composition. Such a nonvolatile storage element includes: an upper electrode layer; a lower electrode layer; and a variable resistance layer disposed between the upper electrode layer and the lower electrode layer. The variable resistance layer has a resistance value that reversibly changes in response to an electric pulse applied between the upper electrode layer and the lower electrode layer. Therefore, it is possible to store information so as not to be volatilized, by setting the information to correspond to the resistance value (see Patent Literature 1, for example). With such a variable resistance nonvolatile memory element, there has been expectation for further progress in miniaturization, operation speed, and power consumption, compared to a flash memory in which a floating gate is used.

CITATION LIST

Patent Literature

[PTL 1] Japanese Unexamined Patent Application Publication No. 2007-235139

SUMMARY OF INVENTION

Technical Problem

However, the above-described conventional variable resistance nonvolatile memory element suffers from difficulty that variation occurs in a resistance value more than expected from a thickness or a film composition of the variable resistance layer, the electrode, and so on, and a size or a shape of a photoresist mask after photolithography.

The present invention has been conceived to overcome the above-described difficulty, and an object of the present invention is to provide a method of manufacturing a variable resistance nonvolatile memory element capable of reducing variation in a resistance value.

Solution to Problem

In order to overcome the above-described difficulty, the inventors of the present invention have found, as a result of keen examination, a cause of variation in a resistance value.

As a result, the inventors of the present invention have found that etch damage in dry etching at the time when forming a nonvolatile storage element is one of the causes of the variation in a resistance value of the above-described conventional variable resistance nonvolatile memory element, as will be described below. The present invention has been conceived based on the underlying Knowledge described above.

More specifically, an embodiment of a method of manufacturing a nonvolatile memory element according to the present invention is a method of manufacturing a nonvolatile memory element having variable resistance, the method including: forming a lower electrode layer above a substrate; forming a variable resistance layer on the lower electrode layer, the variable resistance layer comprising a transition metal oxide; forming an upper electrode layer on the variable resistance layer; forming a hard mask layer on the upper electrode layer; forming a photoresist mask on the hard mask layer; forming a hard mask by performing etching on the hard mask layer, using the photoresist mask; and forming a nonvolatile memory element including the upper electrode layer, the variable resistance layer, and the lower electrode layer, by performing etching, using the hard mask, on the upper electrode layer, the variable resistance layer, and the lower electrode layer, with an etching gas that contains an oxygen deficiency-suppressing gas, wherein, when the variable resistance layer has a resistance value which changes according to change in oxygen content and the etching gas does not contain the oxygen deficiency-suppressing gas, the oxygen content of the etched variable resistance layer changes, in the forming of a nonvolatile memory element, a component included in the oxygen deficiency-suppressing gas adheres to sides of the variable resistance layer as a result of the etching using the etching gas that contains the oxygen deficiency-suppressing gas, and in the forming of a photoresist mask, the photoresist mask is formed to have corner portions in planar view, the corner portions receding toward a center portion of the photoresist mask.

According to the method as stated above, a hard mask is formed using a photoresist mask having the corner portions which recede toward the center portion in planar view, and further the hard mask is used to form a nonvolatile memory element. Thus, the nonvolatile memory element has a rounded shape in planar view without a corner portion forming an angle of 90 degrees, so that non-uniformity in the difference of etching amount of the variable resistance layer is reduced. In addition, since the etching gas contains an oxygen deficiency-suppressing gas, change in the oxygen content of the variable resistance layer is also reduced, so that non-uniformity in etch damage to the variable resistance layer is reduced. Therefore, variation in a resistance value of the nonvolatile memory element can be reduced, and thus it is possible to implement a high-quality nonvolatile memory element without variation in an initial operation pertinent to the resistance values and operational characteristics.

In addition, it is preferable that, in the forming of a photoresist mask, the photoresist mask is formed by projecting, on an exposure subject region, a rectangular shape drawn on a reticle, with a coherence factor during photolithography being smaller than one. It is further preferable that, in the forming of a photoresist mask, the photoresist mask is formed by projecting, on an exposure subject region, a rectangular shape drawn on a reticle, with a coherence factor during photolithography being smaller than 0.5.

According to the method as stated above, a higher-order diffracted light beam is not captured by a lens, which leads to a lack of pattern information drawn on the reticle, causing pattern fidelity to be decreased. As a result, even when the shape drawn on the reticle is a rectangle, there is a lack in information on corner portions of the rectangle, so that the shape of the photoresist mask viewed from above the substrate (shape in planar view) approaches a circle and the corner portions of the photoresist mask are rounded off. As a result, the non-uniformity in the shape is reduced, and thus the difference in incident angles of etching plasma on the etching edge surface in the circumferential portion of the variable resistance layer is reduced. Accordingly, the difference in etching amount (difference in size from a size of the photoresist mask) on the etching edge surface of the variable resistance layer is reduced. With this, the non-uniformity in etch damage applied to the etching edge surface of the variable resistance layer is reduced even when photolithography is performed using a conventionally-used reticle on which a rectangle is drawn, and thus the variation in a resistance value can be reduced, so that it is possible to implement, with low costs, a high-quality nonvolatile memory element without variation in an initial operation pertinent to the resistance values and operational characteristics.

In addition, in the forming of a photoresist mask, the photoresist mask may be formed by performing photolithography using a reticle on which a shape is drawn, the shape having an angle larger than 90 degrees formed by two adjacent edge surfaces.

Here, the shape having adjacent surfaces which form an angle larger than 90 degrees is: a polygonal shape having two surfaces which form an angle larger than 90 degrees, such as a hexagonal shape as illustrated in FIG. 4A or an octagonal shape as illustrated in FIG. 4B; or a shape of which the corner portions are rounded off by connecting adjacent outer lines with curve lines.

According to the method as stated above, even when the coherence factor σ is set to one at the time of photolithography, the shape of the photoresist mask viewed from above the substrate (shape in planar view) approaches a circle. This allows more faithfully transferring pattern information that is drawn on the reticle, and thus it is possible to faithfully form a microscopic pattern which requires high resolution, thereby facilitating designing of a device.

In addition, it is preferable that, in the forming of a variable resistance layer, the variable resistance layer is formed using a tantalum oxide $TaO_x$ where $0<x<2.5$. Furthermore, it is preferable that, in the forming of an upper electrode layer, the upper electrode layer is formed using any one of platinum, iridium, and palladium.

According to the above-described configuration, it is possible to implement a nonvolatile memory element having characteristics of being capable of reversibly-stable rewriting and good retention characteristics, in addition to high-speed operational capability.

In addition, it is preferable that, in the forming of a hard mask layer, the hard mask layer is formed using aluminum titanium nitride.

According to the above-described configuration, it is possible, in the process of performing etching on the upper electrode layer, the variable resistance layer, and the lower electrode layer, to set an etching rate of the upper electrode layer approximately 7.5-fold higher than the etching rate of the hard mask layer by using a mixed gas containing Ar, Cl, and $O_2$, even when the upper electrode layer includes any one of platinum, iridium, and palladium which are materials difficult for etching, and thus the hard mask layer functions sufficiently as a mask layer for the etching performed on the upper electrode layer, the variable resistance layer, and the lower electrode layer, thereby enabling formation of the variable resistance element with a stable shape.

It is to be noted that the present invention can be implemented not only as the method of manufacturing a nonvolatile memory element but also as a nonvolatile memory element. One embodiment of the nonvolatile memory element is a nonvolatile memory element having variable resistance, including:

a lower electrode layer formed above a substrate; a variable resistance layer formed on the lower electrode layer, the variable resistance layer comprising a transition metal oxide; and an upper electrode layer formed on the variable resistance layer. Each of the upper electrode layer, the variable resistance layer, and the lower electrode layer has corner portions receding toward a center portion in planar view. The variable resistance layer has sides to which a component included in an oxygen deficiency-suppressing gas adheres, the oxygen deficiency-suppressing gas being contained in an etching gas used in forming of the upper electrode layer, the variable resistance layer, and the lower electrode layer. It is to be noted that, as an example, a bromine compound adheres to the sides of the variable resistance layer, as the component included in the oxygen deficiency-suppressing gas.

According to the above-described configuration, each of the upper electrode layer, the variable resistance layer, and the lower electrode layer has a rounded shape in planar view without a corner portion having an angle of 90 degrees, and thus the non-uniformity in the difference in the etching amount of the variable resistance layer is reduced. In addition, since the oxygen deficiency-suppressing gas contained in the etching gas adheres to the sides of the variable resistance layer, change in the oxygen content of the variable resistance layer on the etching edge surface is also reduced. Therefore, the non-uniformity in etch damage to the variable resistance layer is reduced, so that the variation in the resistance values of the nonvolatile memory element is reduced, and thus a high-quality nonvolatile memory element is implemented without variation in an initial operation pertinent to the resistance values and operational characteristics.

Advantageous Effects of Invention

With the nonvolatile memory element and the method of manufacturing the nonvolatile memory element according to the present invention, the non-uniformity of the etching amount in a circumferential portion of the variable resistance layer is reduced, and the change in the oxygen content of the variable resistance layer on the etching edge surface is also reduced, so that the non-uniformity of etch damage to the variable resistance layer is reduced. Thus, the variation in a resistance value in the nonvolatile memory element can be reduced, and thus it is possible to implement a high-quality nonvolatile memory element without variation in an initial operation pertinent to the resistance values and operational characteristics.

Therefore, a high-quality nonvolatile memory device free from variation is implemented according to the present invention, and the present invention is highly practically valuable in present day in which a variety of electronic devices using the nonvolatile memory device are available, such as digital home appliances, memory cards, mobile phones, and personal computers.

Figure 7A:
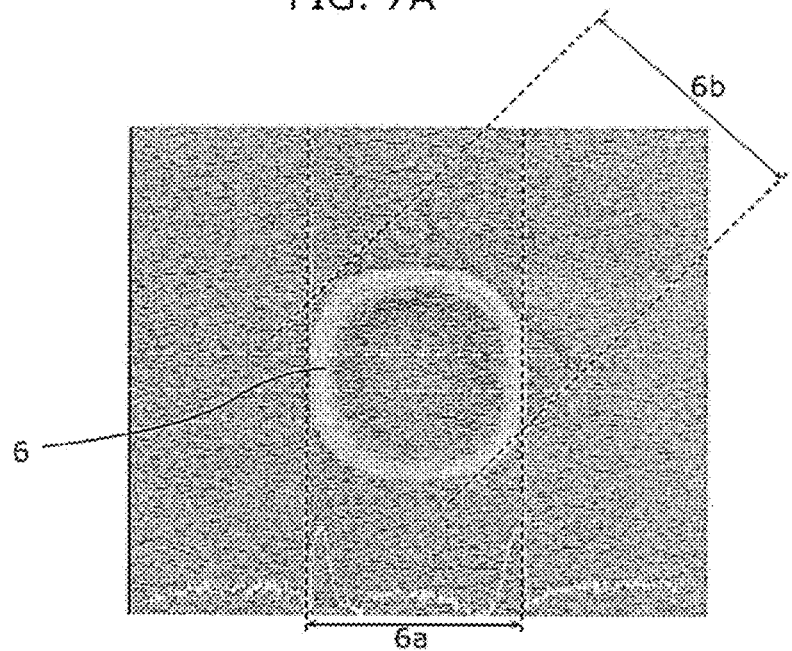
FIG. 7A is a diagram which shows a SEM image of a photoresist mask according to an embodiment of the present invention, which is observed from above a substrate.
Figure 7B:
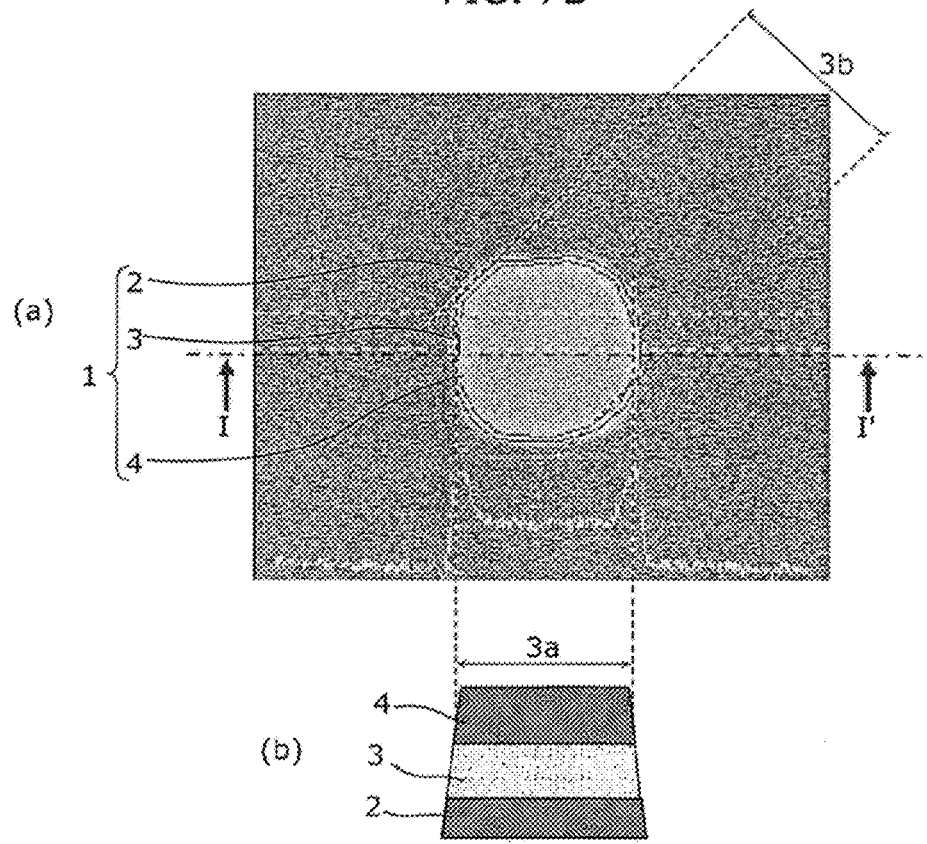

(a) in FIG. 7B is a diagram which shows: a SEM image of a nonvolatile storage element according to an embodiment of the present invention, which is observed from above a substrate; an upper electrode layer; a variable resistance layer; and a lower electrode layer. (b) in FIG. 7B is a cross-sectional diagram of (a) in FIG. 7B taken from the line I-I' and viewed in the arrow direction.

Figure 8A:
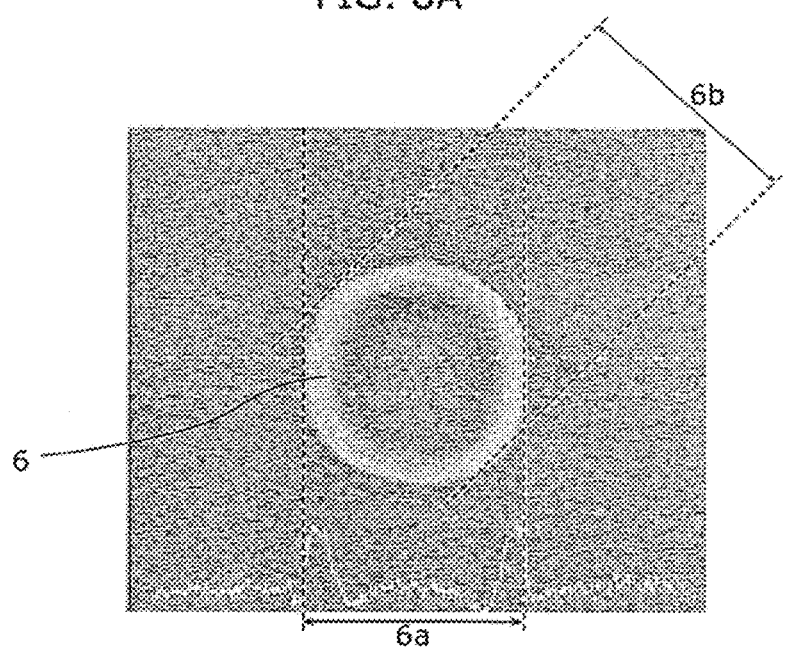

FIG. 8A is a diagram which shows a SEM image of a photoresist mask according to another embodiment of the present invention, which is observed from above a substrate.

Figure 8B:
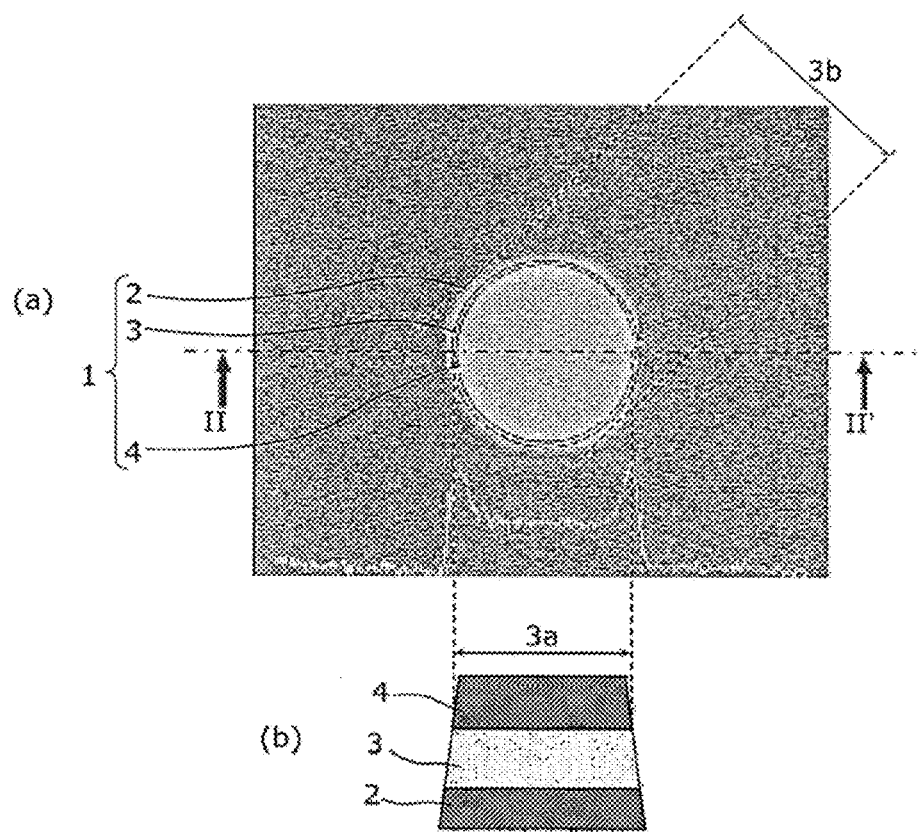

(a) in FIG. 8B is a diagram which shows: a SEM image of a nonvolatile storage element according to an embodiment of the present invention, which is observed from above a substrate; an upper electrode layer; a variable resistance layer; and a lower electrode layer. (b) in FIG. 8B is a cross-sectional diagram of (a) in FIG. 8B taken from the line II-III and viewed in the arrow direction.

Figure 9:
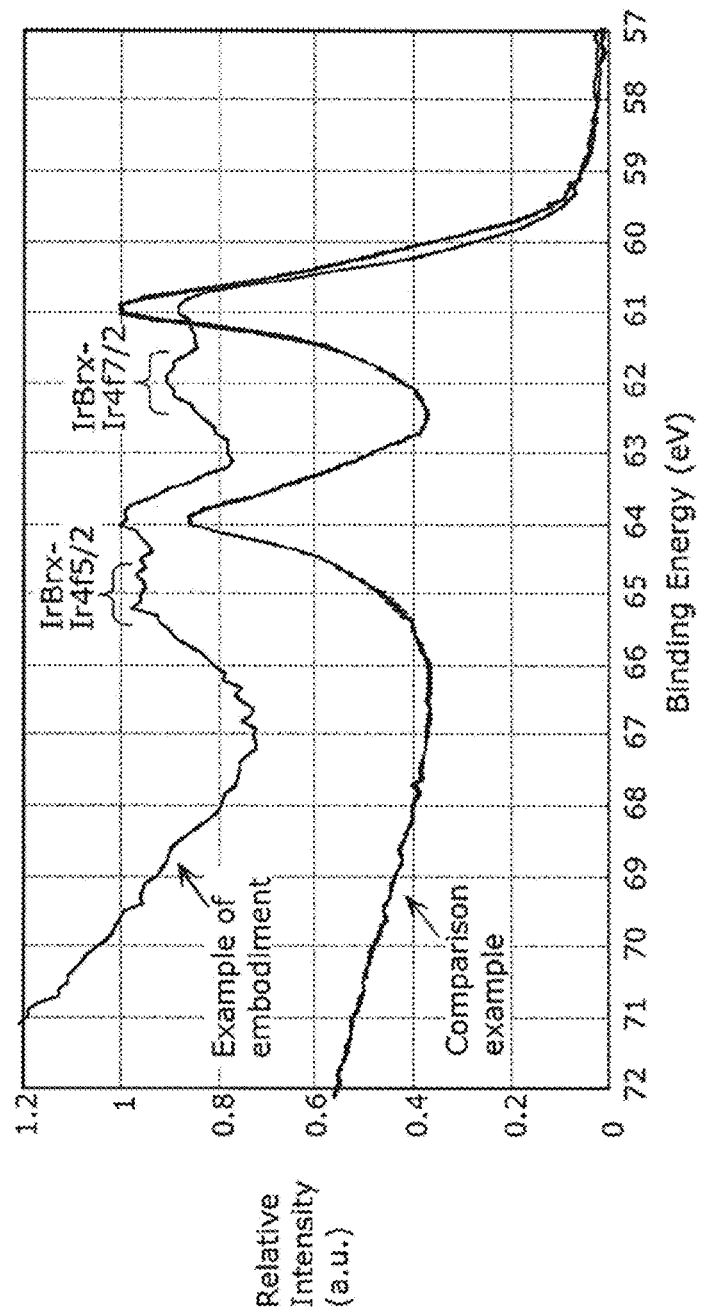

FIG. 9 is a graph which shows the amount of elements which are obtained by analyzing the surface of $TaO_x$ used in a nonvolatile storage element, by performing an XPS analysis.

Figure 10:
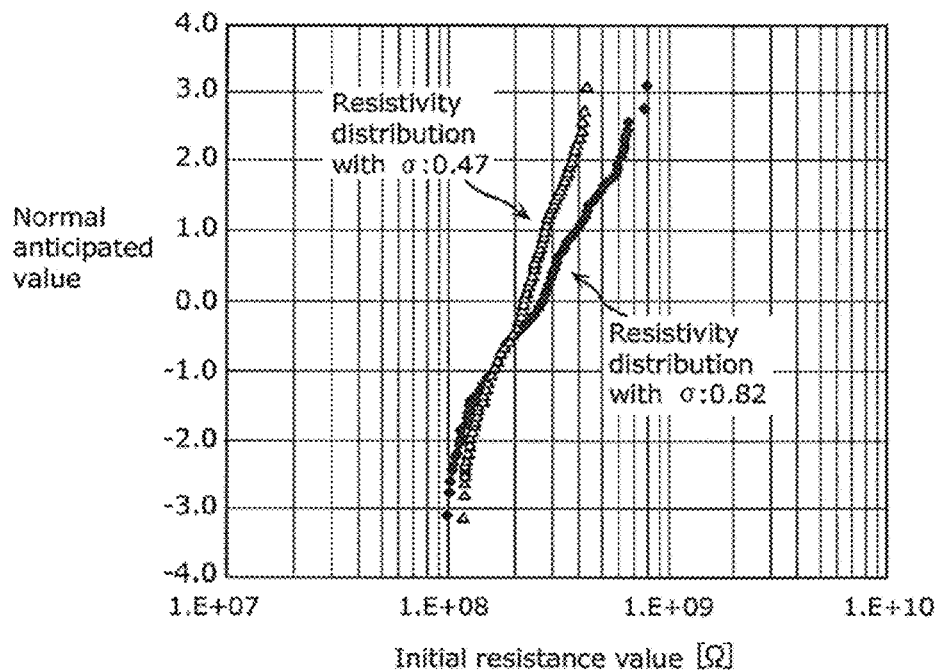

FIG. 10 is a diagram which shows a resistivity distribution of a nonvolatile memory device according to an embodiment of the present invention.

Figure 11A:
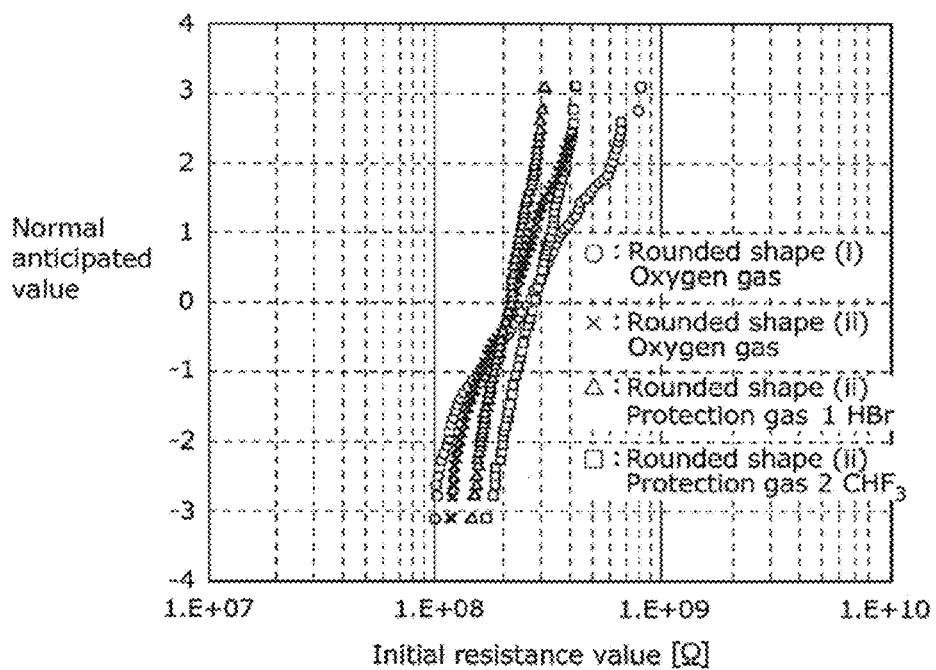

FIG. 11A is a graph which shows a result of an experiment for confirming an effect of shapes of a photoresist mask in planar view, and an effect of an oxygen deficiency-suppressing gas to be included in an etching gas.

Figure 11B:
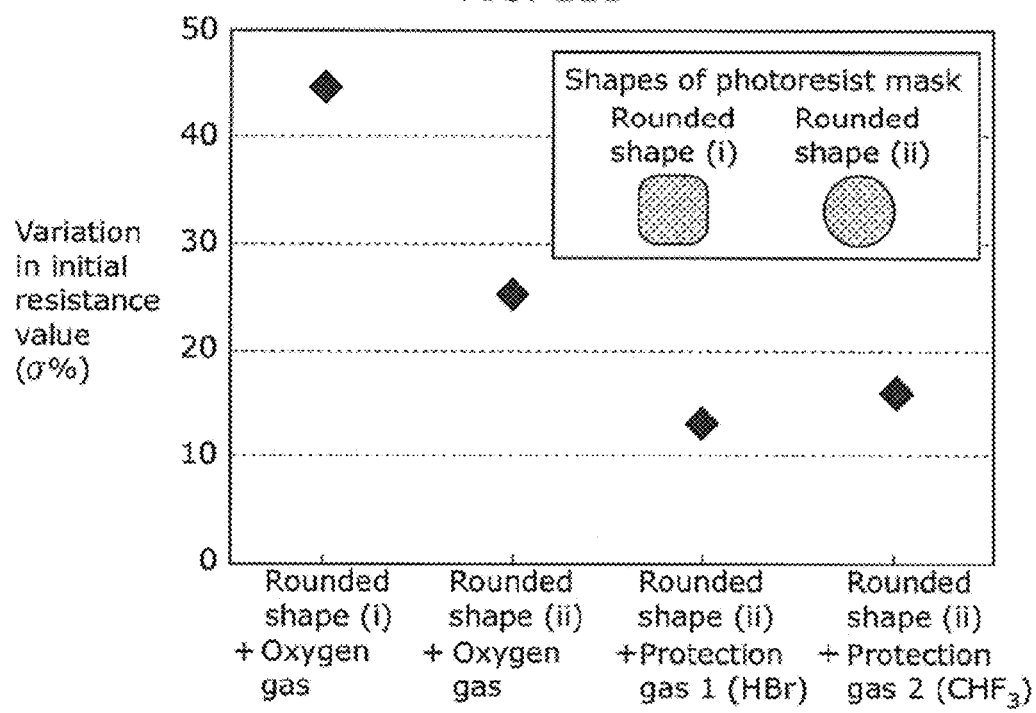

FIG. 11B is a diagram which shows conditions for the experiment shown in FIG. 11A.

Figure 12:
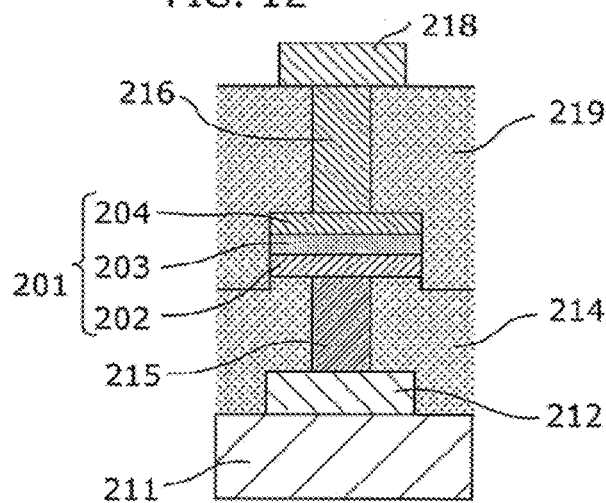

FIG. 12 is a cross-sectional diagram of a main portion representing a configuration of the nonvolatile memory device according to a conventional example.

Figure 13A:
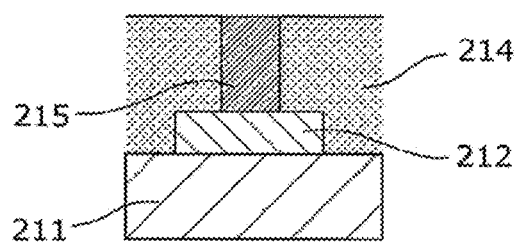

FIG. 13A is a cross-sectional diagram which shows a process of a manufacturing method for the conventional nonvolatile memory device.

Figure 13B:
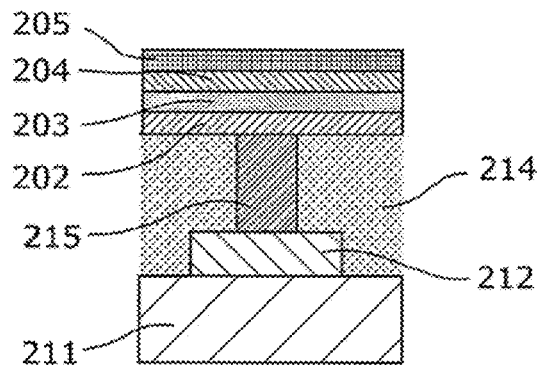

FIG. 13B is a cross-sectional diagram which shows a process (subsequent) of the manufacturing method for the conventional nonvolatile memory device.

Figure 13C:
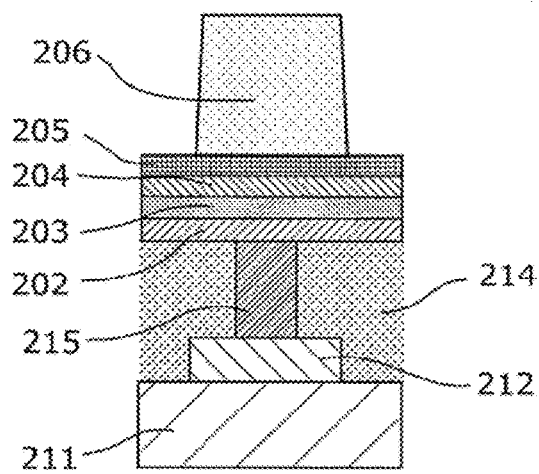

FIG. 13C is a cross-sectional diagram which shows a process (subsequent) of the manufacturing method for the conventional nonvolatile memory device.

Figure 14A:
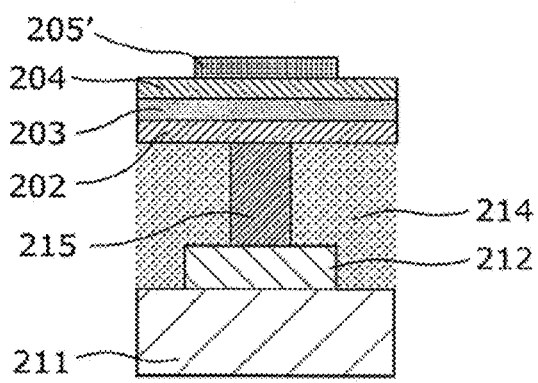

FIG. 14A is a cross-sectional diagram which shows a process of a manufacturing method for the conventional nonvolatile memory device.

Figure 14B:
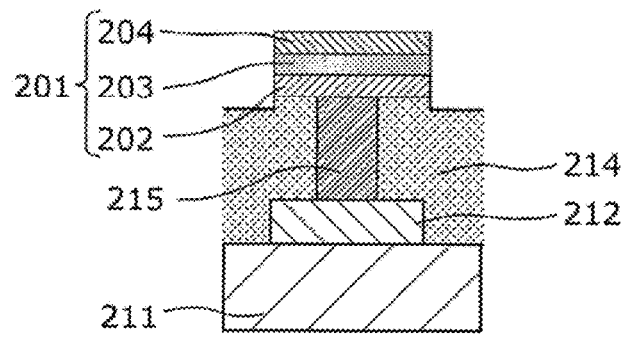

FIG. 14B is a cross-sectional diagram which shows a process (subsequent) of the manufacturing method for the conventional nonvolatile memory device.

Figure 14C:
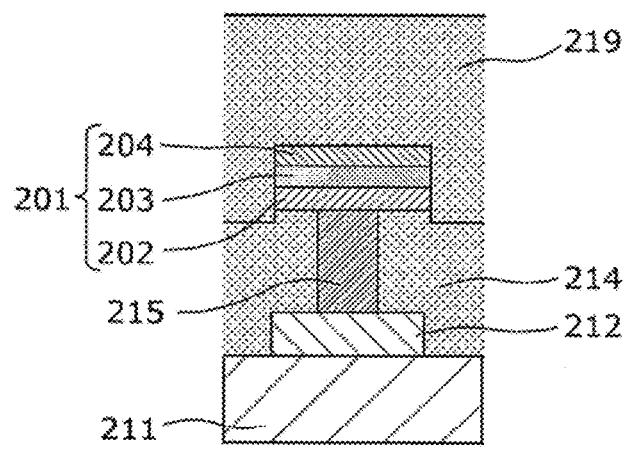

FIG. 14C is a cross-sectional diagram which shows a process (subsequent) of the manufacturing method for the conventional nonvolatile memory device.

Figure 15A:
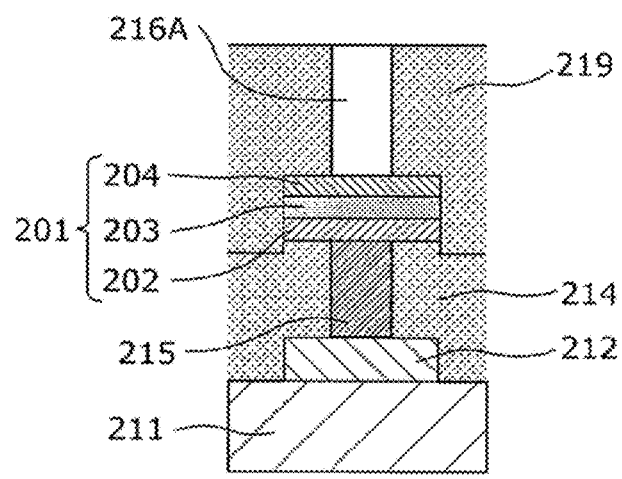

FIG. 15A is a cross-sectional diagram which shows a process (subsequent) of a manufacturing method for the conventional nonvolatile memory device.

Figure 15B:
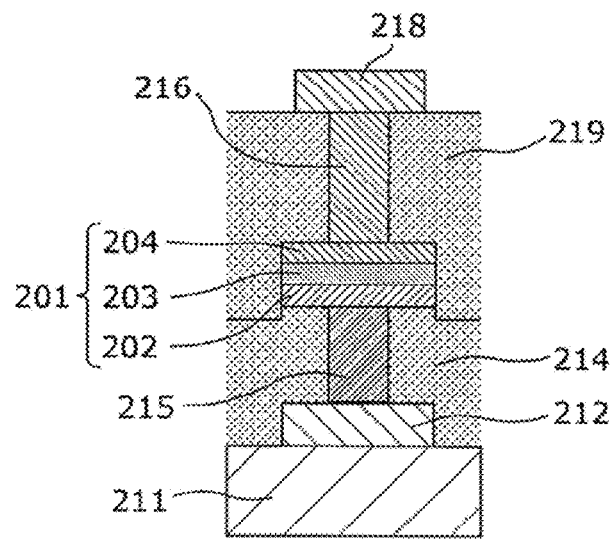

FIG. 15B is a cross-sectional diagram which shows a process (subsequent) of the manufacturing method for the conventional nonvolatile memory device.

Figure 16A:
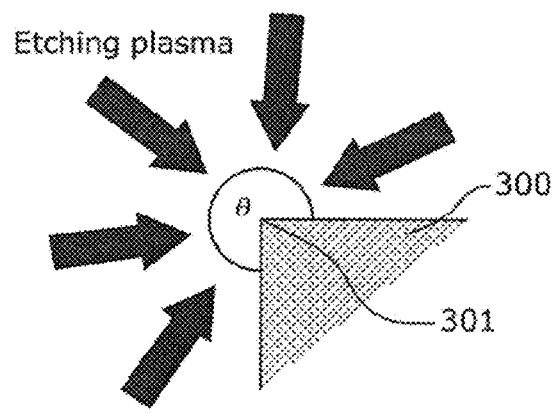

FIG. 16A is a schematic diagram which shows incident angles of plasma with respect to an etching edge surface in a corner portion.

Figure 16B:
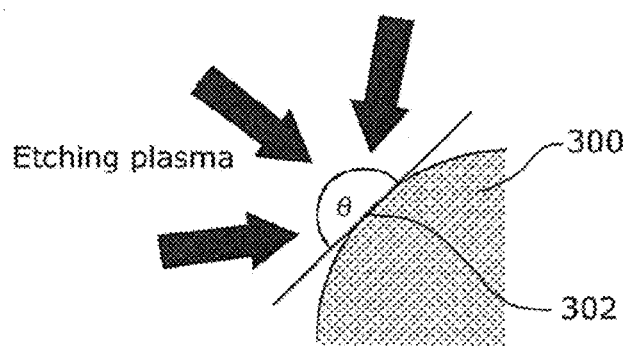

FIG. 16B is a schematic diagram which shows incident angles of plasma with respect to an etching edge surface in a rounded portion.

Figure 16C:
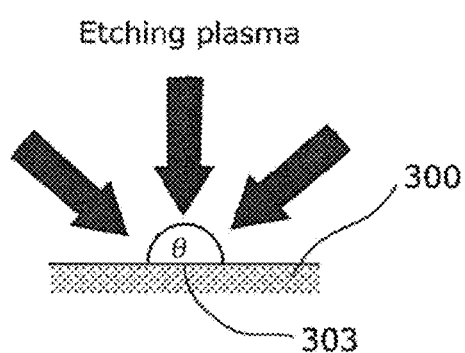

FIG. 16C is a schematic diagram which shows incident angles of plasma with respect to an etching edge surface in a linear portion.

DESCRIPTION OF EMBODIMENTS

As a result of keen examinations in order to reduce variation in a resistance value of a nonvolatile storage element, the inventors of the present invention has estimated that one of the causes of the variation in a resistance value was etch damage in dry etching at the time when forming the nonvolatile storage element, and has accomplished the present disclosure. The following describes the underlying Knowledge obtained through examinations by the inventors, and then describes embodiments according to the present invention.

FIG. 12 is a cross-sectional diagram which shows a configuration of a conventional variable resistance nonvolatile memory device. As shown in FIG. 12, a conventional variable resistance nonvolatile memory device 200 includes: a substrate 211; a first line 212 formed on the substrate 211; and a first interlayer insulating layer 214 formed to cover the surface of the substrate 211 and the first line 212.

A nonvolatile storage element 201 is formed on the first interlayer insulating layer 214. More specifically, a first contact plug 215 is formed to establish an electrical connection to the first line 212, and a lower electrode 202 is formed on the first interlayer insulating layer 214 to establish an electrical connection the first contact plug 215. In addition, a variable resistance layer 203 is formed on the lower electrode layer 202, and an upper electrode layer 204 is formed on the variable resistance layer 203. In other words, the variable resistance layer 203 is disposed between the upper electrode layer 204 and the lower electrode layer 202, and the upper electrode layer 204, the variable resistance layer 203, and the lower electrode layer 202 make up the nonvolatile storage element 201.

Further, a second interlayer insulating layer 219 is formed so as to cover the nonvolatile storage element 201 and the first interlayer insulating layer 214, and a second contact plug 216 is formed so as to penetrate through the second interlayer insulating layer 219, in order to establish an electrical connection to the upper electrode layer 204. A second line 218 is formed on the second interlayer insulating layer 219 to establish an electrical connection to the second contact plug 216.

The following describes a method of manufacturing the conventional nonvolatile memory device 200 which is configured as described above.

First, in the process shown in FIG. 13A, the first line 212 is formed on the substrate 211, then the first interlayer insulating layer 214 is formed to cover the surface of the substrate 211 and the first line 212, and then the first contact plug 215 is formed to penetrate through the first interlayer insulating layer 214 in order to establish a connection to the first line 212.

Next, in the process shown in FIG. 13B, the lower electrode layer 202, the variable resistance layer 203, and the upper electrode layer 204 which make up the nonvolatile storage element 201 are formed on or above the first interlayer insulating layer 214 in this order so as to cover the first contact plug 215. Furthermore, a hard mask layer 205 is formed thereon. It is to be noted that the names of the lower electrode layer 202, the variable resistance layer 203, the upper electrode layer 204, and the hard mask layer 205 are used not only in the condition after etching into a predetermined patterning shape but also in the condition after film formation.

Next, in the process shown in FIG. 13C, a photoresist mask 206 is formed into a predetermined shape pattern (rectangle) by performing a general exposure process and a development process.

Next, in the process shown in FIG. 14A, the hard mask layer 205 is formed into a predetermined patterning shape by performing dry etching, to form a hard mask 205'.

Next, in the process shown in FIG. 14B, each of the upper electrode layer 204, the variable resistance layer 203, and the lower electrode layer 202 is formed into a predetermined patterning shape by performing dry etching using the hard mask 205', and subsequently the hard mask 205' is removed. Through the processes described above, the nonvolatile storage element 201 is formed which includes the upper electrode layer 204, the variable resistance layer 203, and the lower electrode layer 202.

Next, in the process shown in FIG. 14C, the second interlayer insulating layer 219 is deposited to cover the first interlayer insulating layer 214, the upper electrode layer 204, the variable resistance layer 203, and the lower electrode layer 202, and then the second interlayer insulating layer 219 is planarized by performing a CMP planarization process.

Next, in the process shown in FIG. 15A, a second contact plug opening 216A is formed so as to penetrate through the second interlayer insulating layer 219 to the upper electrode layer 204, at a predetermined position in which the second contact plug 216 is formed so as to connect to the upper electrode layer 204 of the nonvolatile storage element 201.

Next, in the process shown in FIG. 15B, the second contact plug 216 is formed in the second contact plug opening 216A through a filling formation process. Next, the second line 218 to be connected to the second contact plug 216 is formed on the second interlayer insulating layer 219.

When resistance values are measured by applying a voltage between the lower electrode layer 202 and the upper electrode layer 204 of each of the conventional nonvolatile memory devices 200 that are manufactured in the above-described manner, the resistance values significantly varied in the nonvolatile memory devices 200. As a result of studies to find the cause of the foregoing, it was speculated that there was a factor for increasing variation in the process shown in FIG. 13C (the process of forming the photoresist mask 206), the process shown in FIG. 14A (the process of forming the hard mask 205'), and the process shown in FIG. 14B (the process of forming the nonvolatile storage element 201). The following explains the foregoing.

FIG. 16A to FIG. 16C are schematic diagrams which show incident angles of plasma during an etching process, according to the differences between the shapes of the etching edge surface of an etching subject 300.

FIG. 16A is a schematic diagram which shows the case where the etching subject 300 has a corner portion with an angle of 90 degrees in planar view. In the diagram, the arrows indicate the incident directions of plasma on an etching edge surface 301 in the corner portion, and θ indicates the range of the incident angles. FIG. 16B is a schematic diagram which shows the case where the etching subject 300 has a curved shape in planar view. In the diagram, the arrows indicate the incident directions of plasma on an etching edge surface 302 in the curved portion, and θ indicates the range of the incident angles of the plasma. FIG. 16C is a schematic diagram which shows the case where the etching subject 300 has a linear shape in planar view. In the diagram, the arrows indicate the incident directions of plasma on an etching edge surface 303 in the linear portion, and θ indicates the range of the incident angles of the plasma.

The range of the incident angles θ of the plasma on the etching edge surface 301 in the corner portion with an angle of 90 degrees shown in FIG. 16A is 270 degrees, the range of the incident angles θ of the plasma on the etching edge surface 302 in the curved portion shown in FIG. 16B is 180 degrees, and the range of the incident angles θ of the plasma on the etching edge surface 303 in the linear portion shown in FIG. 16C is 180 degrees. This shows that the range of the incident angles of plasma differs according to the shape of the etching subject 300 in planar view, and that the range of the incident angles of plasma is larger in the corner portion of the etching edge surface 301 than in the curved portion of the etching edge surface 302 or than in the linear portion of the etching edge surface 303. When the range of the incident angles of plasma is large, the plasma is incident in a wide range, and thus the amount to be etched is large, leading to increase in etch damage resulting from the etching.

In general, dry etching causes etch damage on the dry etching edge surface. The etch damage is caused: for example, when oxygen dissociates from an oxide due to reduction action caused by etching gas in the dry etching in which an oxide is the etching subject, which results in change in a resistance value in the etching edge surface of the oxide; or fluorine is injected into an oxide from the etching edge surface due to use of a mixed gas including, for example, a fluorinated gas, for the etching gas used in dry etching, which results in change in a resistance value in the etching edge surface of the oxide.

In addition, as to the etch damage, how the etch damage takes place (the amount of damage) changes according to the shape of the etching edge surface of the etching subject.

In the conventional nonvolatile storage element 201, since the photoresist mask 206 used for forming the nonvolatile storage element 201 has a rectangle planar shape when viewed from above the substrate, the amount of dry etching increases in the corner portion as shown in FIG. 16A during the dry etching process, and thus the amount of etching is non-uniform in the etching edge surface in a circumferential portion the nonvolatile storage element 201. Thus, the amount of etch damage to the nonvolatile storage element 201 is also non-uniform in the circumferential portion. Thus, the resistance value of the nonvolatile storage element 201 changes between different nonvolatile storage elements (in other words, varies).

In addition, the inventors found an advantageous effect that the variation in the resistance value of the nonvolatile storage element can be reduced by using, as the etching gas, a gas that reduces oxygen defect on the etching edge surface (for example, an oxygen gas that facilitates oxidation, a hydrobromic (HBr) gas that protects the sides, and a trifluoromethane ($CHF_3$) gas). When such a gas that reduces the oxygen defect is employed as the etching gas, the advantageous effect of reducing the oxygen defect becomes non-uniform on the etching edge surface as the amount of etching increases on the etching edge surface. More specifically, when the amount of etching increases on the etching edge surface, the amount to be etched is large even when oxidation is facilitated, and thus the oxygen defect state remains. Or, even when a gas for protecting the sides adheres, the protection gas itself is etched away, and thus the advantageous effect of reducing the oxygen defect becomes non-uniform on the etching edge surface, and the amount of etch damage also becomes non-uniform in the circumferential portion, resulting in decrease in the advantageous effect.

Here, the hydrobromic (HBr) is explained as an example of the protection gas. it is possible to reduce oxygen dissociation or injection of impurities due to an etching gas, by adhesion, on the etching edge surface of the variable resistance layer, of products such as a bromine compound formed by reacting to bromine resolved in the etching plasma. Accordingly, it is possible to reduce etch damage to the variable resistance layer. Thus, variation in characteristics of the nonvolatile storage element can be reduced, and thus it is possible to implement a high-quality nonvolatile storage element without variation in an initial operation pertinent to the resistance values and characteristics.

In addition, the hydrobromic is a relatively stable gas, which responds poorly to an oxide and has a low etching rate. Therefore, etching is not performed on the variable resistance layer that is a metal oxide. More specifically, the hydrobromic gas only performs a role to protect the etching edge surface without causing etch damage. It is to be noted that the hydrobromic gas is a gas highly used in general semiconductor processes.

The present invention has been conceived based on the underlying knowledge described above. However, the present invention is not limited by the processes, materials, conditions, and so on, described above.

The following describes a nonvolatile storage element according to embodiments of the present invention, with reference to the drawings. It is to be noted that the same reference numerals are assigned to the same elements, and descriptions for them may be omitted. Furthermore, each of the structural elements in the diagrams is schematically illustrated for easier comprehension, and thus the shapes and the like are not precisely represented, and the numbers of the items are set to be the numbers that are easy to be illustrated. In other words, each of the embodiments describes below represents an example of a preferred embodiment according to the present invention. The numerical values, shapes, materials, structural elements, the arrangement and connection of the structural elements, steps, the processing order of the steps, and so on, shown in the following embodiments are mere examples and therefore do not limited the present invention The present invention is limited only by the scope of claims. Thus, among the structural elements according to the following embodiments, structural elements not recited in any one of the independent claims defining the most generic part of the inventive concept are described as not indispensable for achieving the object of the present invention, however, as configuring more preferred embodiment.

[Configuration of Nonvolatile Memory Device]

Figure 1:
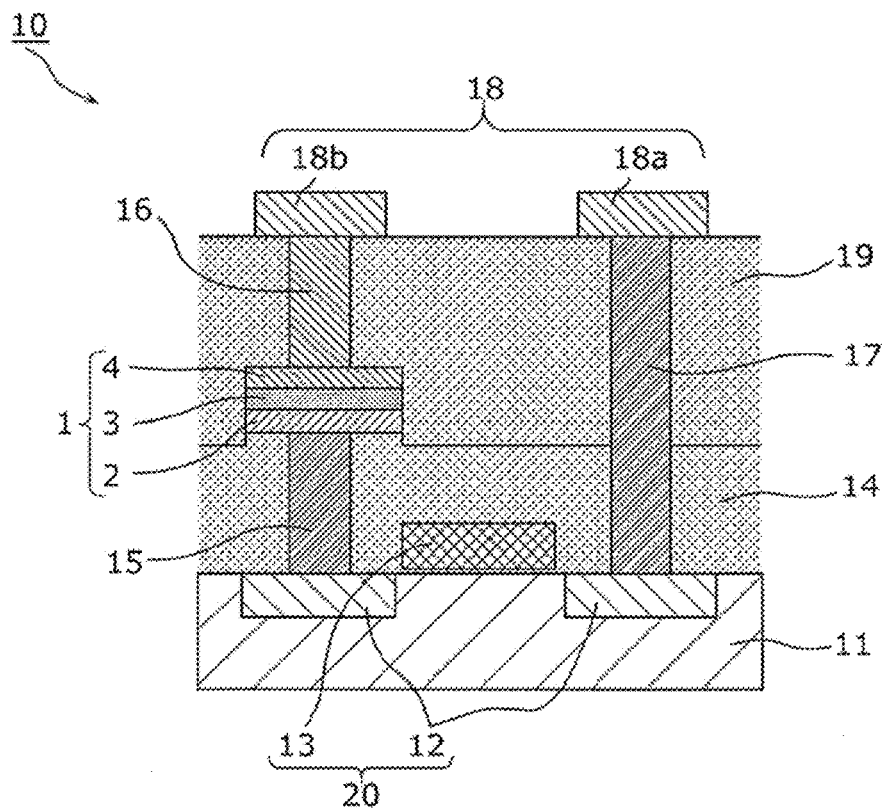
FIG. 1 is a cross-sectional diagram which shows a configuration of a nonvolatile memory device according to an embodiment of the present invention.

FIG. 1 is a diagram which shows a configuration of a nonvolatile memory device 10 according to an embodiment of the present invention. It is to be noted that the nonvolatile memory device 10 is a device which includes a nonvolatile memory element according to the present invention and peripheral structural elements. As shown in FIG. 1, the nonvolatile memory device 10 according to the present embodiment includes: a substrate (for example, a silicon substrate) 11; and a transistor 20 above the substrate 11. The transistor 20 includes source and drain layers 12, and a gate layer 13. In addition, a first interlayer insulating layer (for example, $SiO_2$) 14 is formed on the surface of the substrate 11, to cover the source and drain layers 12 and the gate layer 13.

A nonvolatile memory element 1 is formed on the first interlayer insulating layer 14. More specifically, a first contact plug 15 is formed to electrically connected to one of the source and drain layers 12, and a lower electrode layer 2 that is connected to the first contact plug 15 is formed on the first interlayer insulating layer 14. In addition, a variable resistance layer 3 is formed on the lower electrode layer 2, and an upper electrode layer 4 is formed on the variable resistance layer 3. In other words, the variable resistance layer 3 is disposed between the upper electrode layer 4 and the lower electrode layer 2, and the upper electrode layer 4, the variable resistance layer 3, and the lower electrode layer 2 make up the nonvolatile memory element 1 according to the present invention.

Further, a second interlayer insulating layer (for example, $SiO_2$) 19 is formed to cover the nonvolatile memory element 1 and the first interlayer insulating layer 14, and a second contact plug 16 is formed to penetrate through the second interlayer insulating layer 19 so as to be connected to the upper electrode layer. In addition, a third contact plug 17 is formed to penetrate through the first interlayer insulating layer 14 and the second interlayer insulating layer 19 so as to be connected to the other of the source and drain layers 12. A second line layer 18b to be connected to the second contact plug 16 and a first line layer 18a be connected to the third contact plug 17 are formed on the second interlayer insulating layer 19. The first line layer 18a and the second line layer 18b make up the line layer 18. It is sufficient that the first, second, and third contact plugs 15, 16, 17 comprise a conductive material for electrically connecting one of the source and drain layers 12 and the lower electrode layer 2, or the other of the source and drain layers 12 and the line layer 18a. For example, tungsten (W) can be used.

The following explains in detail the nonvolatile memory element 1 described above.

As shown in FIG. 1, the nonvolatile memory element (variable resistance element) 1 according to the present embodiment includes: the upper electrode layer 4; the lower electrode layer 2; and the variable resistance layer 3 disposed therebetween. Here, the variable resistance layer 3 in the nonvolatile memory element 1 comprises an oxygen-deficient transition metal oxide, for example. The oxygen-deficient transition metal oxide is an oxide having a composition x of oxygen O that is less than a composition in a stoichiometrically stable state (in this case, an insulation in general), where a transition metal is denoted as M, oxygen is denoted as O, and a transition metal oxide is denoted as $MO_x$. For the oxygen-deficient transition metal oxide, an oxide including various transition metals can be used, and it is possible, by employing a variable resistance layer including a tantalum oxide ($TaO_x$, $0<x<2.5$) or a hafnium oxide ($HfO_x$, $0<x<2.0$), to obtain a nonvolatile memory element which has characteristics that enable reversibly stable rewriting and which utilizes resistance changing phenomenon. As to the foregoing, the Applicant of the present application has filed an application as a related patent application, and the tantalum oxide is described in detail in the International Publication No. 2008/059701 (Patent Literature 2) and the hafnium oxide is described in detail in the International Publication No. 2009/050861 (Patent Literature 3).

It is to be noted that, although FIG. 1 illustrates the case where the variable resistance layer 3 is formed as a single layer, the oxygen-deficient transition metal oxide may include at least two layers; that is, a layer including highly-concentrated oxygen and a layer including low-concentrated oxygen. As to the transition metal oxide formed in a stacking structure having two layers described above, the Applicant of the present application has filed an application as a related patent application, and the stacking structure of the tantalum oxide is described in detail in the International Publication No. 2008/149484 (Patent Literature 4).

When a tantalum oxide is used as the oxygen-deficient transition metal oxide, the oxygen content atomic percentage of the first variable resistance layer ($TaO_y$, a layer including highly-concentrated oxygen) is set to 67.7 to 71.4 atm % ($2.1 \le y < 2.5$), and the oxygen content atomic percentage of the second variable resistance layer ($TaO_x$, a layer including low-concentrated oxygen) is set to 44.4 to 65.5 atm % ($0.8 \le x < 1.9$). When a hafnium oxide is used, the oxygen content atomic percentage of the first variable resistance layer ($HfO_y$, a layer including highly-concentrated oxygen) is set to 64.3 to 66.7 atm % ($1.8 < y < 2.0$), and the oxygen content atomic percentage of the second variable resistance layer ($HfO_x$, a layer including low-concentrated oxygen) is set to 47.4 to 61.5 atm % ($0.9 \le x \le 1.6$). In both cases, it is desirable that the thickness of the first variable resistance layer (the layer including highly-concentrated oxygen) is 1 nm or larger to 8 nm or smaller for the case of $TaO_y$, and 3 nm or larger to 4 nm or smaller for the case of $HfO_y$. In either case, it is not desirable when the thickness of the first variable resistance layer increases, because a voltage necessary for an initial breakdown that is performed to put the variable resistance layer into a state capable of causing resistance change as a result of application of the voltage immediately after manufacture also increases, which causes damage in some cases to a nonlinear element (for example, a diode) connected to the variable resistance element in series. By designing the first variable resistance layer to have a high oxygen content atomic percentage, a voltage can be easily applied near an interface to the electrode connected to the first variable resistance layer, allowing the initial breakdown with a low voltage, and thus a resistance change caused by oxidation or reduction can be easily developed. This allows obtaining good memory cell characteristics capable of initial breakdown with a low voltage.

Noble metal such as platinum, iridium, palladium, and the like can be used for the lower electrode layer 2 and the upper electrode layer 4 which are included in the nonvolatile memory element 1. The standard electrode potentials of the platinum, iridium, and palladium are 1.18 eV, 1.16 eV, and 0.95 eV, respectively, in general, the standard electrode potential is one of the indexes of resistivity to oxidation. The higher value of the standard electrode potential means more resistant to oxidation, and the lower value of the standard electrode potential means more susceptible to oxidation. The resistance changing phenomenon is more likely to occur as the difference in the standard electrode potentials between an electrode material and a metal comprising a variable resistance layer is larger, and the resistance changing phenomenon is less likely to occur as the difference is smaller. Accordingly, it is speculated that the degree of the susceptibility to oxidation of the variable resistance material with respect to the electrode material plays a significant role in the mechanism of the resistance changing phenomenon. The standard electrode potential which indicates the susceptibility to oxidation or reduction is −0.60 eV for tantalum, and −1.55 eV for hafnium. Each of the standard electrode potentials is lower than the standard electrode potential for each of the platinum, iridium, and palladium. Accordingly, it is considered that the oxidation or reduction reaction of the tantalum oxide or the hafnium oxide occurs near the interface between the variable resistance layer 3 and the lower electrode layer 2 or the upper electrode layer 4 which includes one of platinum, iridium, and palladium, to receive or give oxygen, leading to the resistance changing phenomenon.

Each of the tantalum oxide and the hafnium oxide changes from a low resistance state to a high resistance state in response to application of a voltage of which an absolute value of the first polarity (positive or negative) is greater than or equal to the first threshold, and changes from the high resistance state to the low resistance state in response to application of a voltage of which an absolute value of the second polarity (negative or positive) that is different from the first polarity is greater than or equal to the second threshold. In other words, the tantalum oxide and the hafnium oxide have bipolar variable resistance characteristics. When a voltage to be applied to an electrode which is in contact with the first variable resistance layer (the layer including highly-concentrated oxygen) with respect to an electrode which is in contact with the second variable resistance layer (the layer including low-concentrated oxygen) is positive, the variable resistance layer 3 changes from the low resistance state to the high resistance state by applying a voltage that is of a positive polarity and that is greater than or equal to the first threshold. When a voltage to be applied to an electrode which is in contact with the first variable resistance layer (the layer including highly-concentrated oxygen) with respect to an electrode which is in contact with the second variable resistance layer (the layer including low-concentrated oxygen) is negative, the variable resistance layer 3 changes from the high resistance state to the low resistance state by applying a voltage that is of a negative polarity and that has an absolute value greater than or equal to the second threshold.

In addition, different materials may be used between the first transition metal included in the first variable resistance layer (the layer including highly-concentrated oxygen) and the second transition metal included in the second variable resistance layer (the layer including low-concentrated oxygen). In this case, it is preferable that the first variable resistance layer has a degree of oxygen deficiency lower than a degree of oxygen deficiency of the second variable resistance layer. Here, the degree of oxygen deficiency is a ratio of deficient oxygen with respect to the amount of oxygen included in an oxide of the stoichiometric composition, in each of the transition metals. When the transition metal is tantalum (Ta), for example, the composition of the stoichiometric oxide is $Ta_2O_5$, and thus it can be denoted as $TaO_{2.5}$. Thus, the degree of oxygen deficiency of $TaO_{2.5}$ is 0%. In addition, the degree of oxygen deficiency of the oxygen-deficient tantalum oxide which has the composition represented as TaO$_{1.5}$ is expressed as follows; the degree of oxygen deficiency=(2.5−1.5)/2.5=40%.

With the variable resistance layer 3 that has the stacking structure described above, voltages applied between the upper electrode layer 4 and the lower electrode layer 2 during the resistance change are distributed by larger amount to the first variable resistance layer, and thus the oxidation-reduction reaction is more likely to occur in the first variable resistance layer. In addition, when materials of the first transition metal and the second transition metal are different from each other, it is preferable that a standard electrode potential of the first transition metal is lower than a standard electrode potential of the second transition metal. It is considered that the resistance changing phenomenon occurs as a result of a change in a resistance value caused by the oxidation-reduction reaction in a minute filament formed in the first oxide layer having a high resistance. A stable resistance change can be obtained by, for example, employing oxygen-deficient tantalum oxide for the second variable resistance layer and titanium oxide (TiO$_2$) for the first variable resistance layer. Titanium (standard electrode potential=−1.63 eV) is a material having a lower standard electrode potential than a standard electrode potential of tantalum (standard electrode potential=−0.6 eV). The oxidation-reduction reaction is more likely to occur in the first variable resistance layer by disposing, in the first oxide layer, a metal oxide with a lower standard electrode potential than a standard electrode potential of the second oxide layer.

[Operation of Nonvolatile Memory Device]

The operation described below is performed when writing and reading information in and from the desired nonvolatile memory element 1 in the nonvolatile memory device 10 configured as described above according to the present embodiment. A predetermined voltage is applied between the second line layer 18b (for example, a bit line) and the first line layer 18a (for example, a source line), and a voltage greater than or equal to a threshold of the transistor 20 is applied to a word line (not illustrated) connected to the gate layer 13 included in the transistor 20, so as to turn ON the transistor 20, thereby applying, to the nonvolatile memory element 1, a voltage sufficient for changing the resistance (a voltage of which an absolute value is greater than or equal to the first threshold voltage or the second threshold voltage according to the polarity). It is possible to change the nonvolatile memory element 1 between the high resistance state and the low resistance state, by setting the polarity or the amount of a voltage provided to the nonvolatile memory element 1 in the manner as stated above. The nonvolatile memory element 1 can serve as a nonvolatile memory, by storing the high resistance state and the low resistance state of the nonvolatile memory element 1 so as to correspond to items of information "1" and "0", respectively. When a memory cell array includes a plurality of the nonvolatile memory elements 1 arranged two-dimensionally, a predetermined voltage is applied to a word line, a bit line, and a source line, related to the (selected) nonvolatile memory element in which information is to be written and from which information is to be read. In addition, as to the (non-selected) nonvolatile memory element which is not the subject of reading and writing information, it is necessary to prevent a voltage from being applied to the non-selected nonvolatile memory element, by applying a predetermined voltage to a related word line, bit line, and source line, so as to avoid disturb due to a sneak current via different one of the nonvolatile memory elements included in the memory cell array.

The nonvolatile memory device 10 according to the present embodiment configured as described above is characterized by forming, during a forming process of the nonvolatile memory element 1, a photoresist mask having a receding corner portion (a rounded shape in planar view) such that the amount of receding of the etching edge surface in a circumferential portion of the nonvolatile memory element 1 is substantially the same irrespective of a position of the edge surface, and forming the nonvolatile memory element 1 using the photoresist mask that has such a particular shape.

[Method of Manufacturing the Nonvolatile Memory Device]

The following describes a method of manufacturing the nonvolatile memory device 10 according to the present embodiment. It should be understood that the method of manufacturing the nonvolatile memory device 10 includes a method of manufacturing the nonvolatile memory element 1 according to an embodiment of the present invention.

Each of FIGS. 2A to 2C, FIGS. 5A to 5C, and FIGS. 6A and 6B is a diagram which shows a process of manufacturing the nonvolatile memory device 10 according to the present embodiment. It is to be noted that, although a number of nonvolatile memory elements 1 are generally arranged on a substrate, only one of the nonvolatile memory elements 1 is illustrated here for a simpler illustration. In addition, some portions are enlarged in illustration for easier comprehension.

Figure 2A:
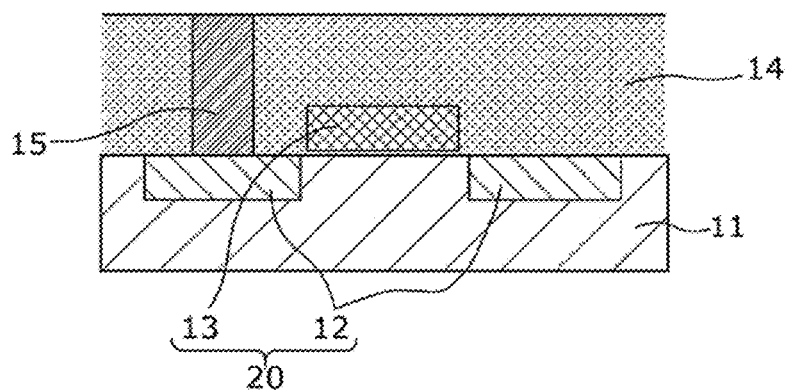
FIG. 2A is a cross-sectional diagram which shows a process of a manufacturing method for the nonvolatile memory device according to an embodiment of the present invention.

First, in the process shown in FIG. 2A, the source and drain layers 12 and the gate layer 13 are formed on or above the substrate 11, and then the first interlayer insulating layer 14 is formed. In addition, the first contact plug 15 which penetrates through the first interlayer insulating layer 14 to be connected to one of the source and drain layers 12 is formed by the filling formation process. As the first contact plug 15, tungsten or a barrier film may be used, for example.

Figure 2B:
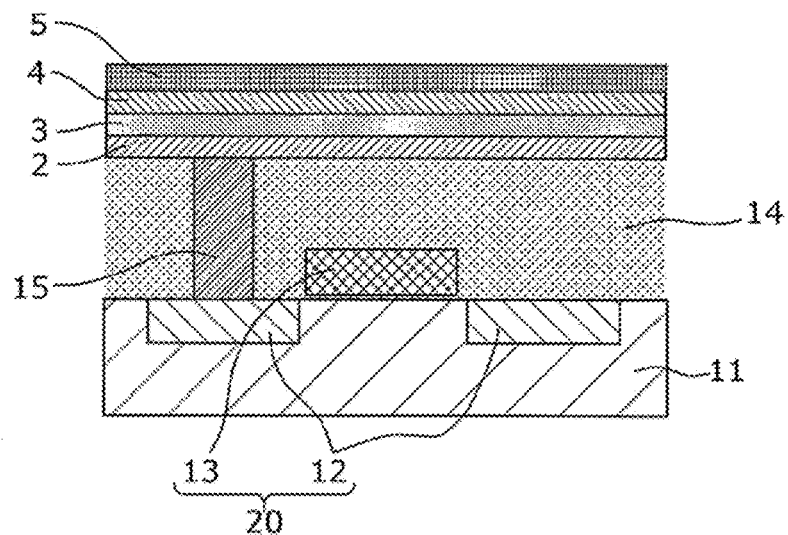
FIG. 2B is a cross-sectional diagram which shows a process (subsequent) of the manufacturing method for the nonvolatile memory device according to an embodiment of the present invention.

Next, in the process shown in FIG. 2B, the first interlayer insulating layer 14, the lower electrode layer 2, the variable resistance layer 3, and the upper electrode layer 4 are formed in this order to cover the upper surface of the first contact plug 15, and then a hard mask layer 5 is formed on the upper electrode layer 4.

Here, the process shown in FIG. 2B is explained in more detail below. For the lower electrode layer 2, tantalum nitride (TaN) is formed to be 30 nm. The variable resistance layer 3 is formed into a stacking structure of tantalum oxide, in which a low-concentrated oxide layer (a second variable resistance layer) comprising TaO$_x$ (0<x<2.5) is formed to be 45 nm, and a high concentration oxide layer (a first variable resistance layer) comprising TaO$_y$ (x<y, for example, 2.1≤y≤2.5) which has a larger oxygen content than an oxygen content of the above-described TaO$_x$ is formed to be 5 nm. The thickness of TaO$_x$ is sufficient to be 10 nm or larger. At this time, the variable resistance layer 3 may be formed by depositing TaO$_x$ for 50 nm, performing an oxidation process on the upper surface of TaO$_x$ through plasma oxidation, and forming the high concentration oxide layer that comprises TaO$_y$ (x<y, for example, 2.1≤y≤2.5) having an oxygen content larger than an oxygen content of TaO$_x$, on the low-concentrated oxide layer that comprises TaO$_x$. In this case, the method of the oxidation process is not limited to the plasma oxidation, and a process of heat treatment in the presence of oxygen and the like may be performed which has an effect of oxidizing the surface. In addition, in stead of the oxidation process, Ta$_2$O$_5$ may be deposited for 5 nm after depositing TaO$_x$ for 45 nm. As the upper electrode layer 4, iridium (Ir) is formed to be 80 nm, and as the hard mask layer 5, aluminum titanium nitride (TiAlN) is formed to be 100 nm. It is to be noted that the names of the lower electrode layer 2, the variable resistance layer 3, the upper electrode layer 4, and the hard mask layer 5 are used not only in the condition after etching into a patterning shape but also in the condition after film formation.

Figure 2C:
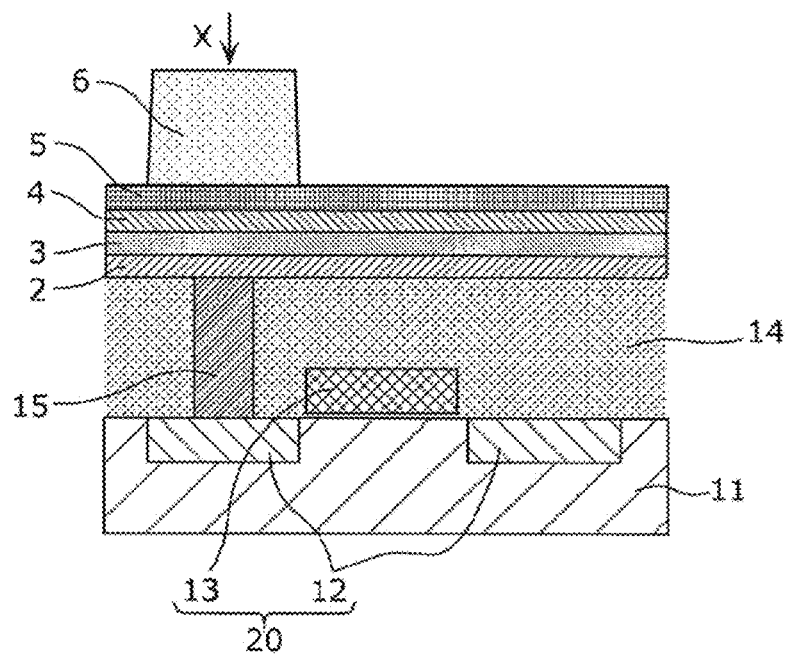
FIG. 2C is a cross-sectional diagram which shows a process (subsequent) of the manufacturing method for the nonvolatile memory device according to an embodiment of the present invention.

Next, in the process shown in FIG. 2C, pattern formation of the photoresist mask 6 is performed by an exposure process and a development process (photolithography).

Figure 3:
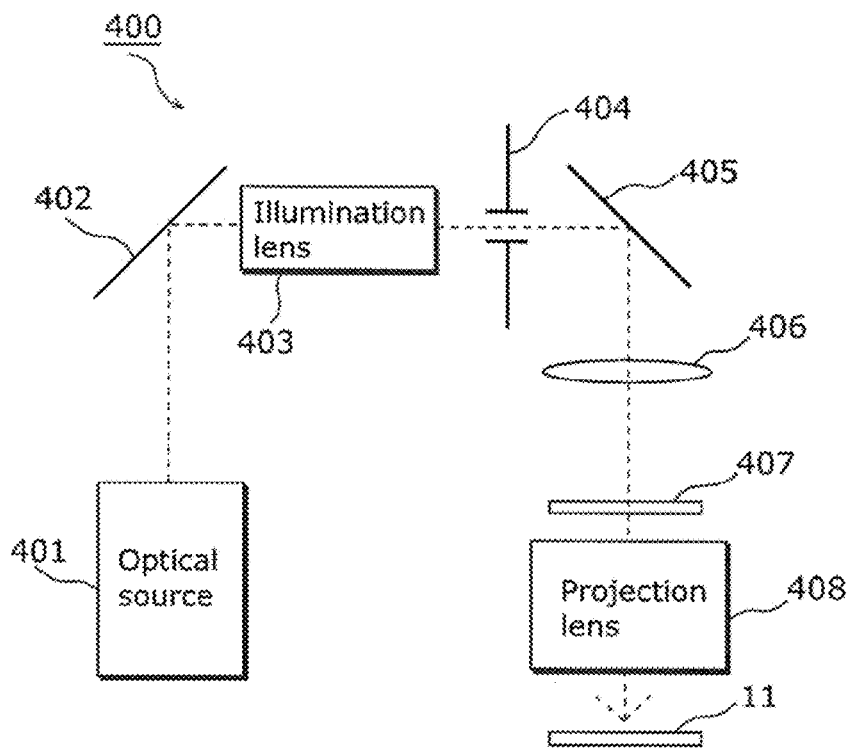
FIG. 3 is a schematic view which shows a general stepper.

FIG. 3 is a schematic view which shows a configuration of a stepper 400 used in the process shown in FIG. 2C. In FIG. 3, the stepper 400 is a device which includes: an optical source 401 such as a krypton fluoride (KrF) excimer laser; mirrors 402 and 405; a illumination lens 403; a illumination aperture 404; a condenser lens 406; a reticle 407; and a projection lens 408, and which performs exposure on an exposure subject region on the substrate 11.

A laser beam output from the optical source 401 is guided to the illumination lens 403 through a routing optical system including the mirror 402, adjusted to be a light beam which has: predetermined light intensity; a luminous intensity distribution; an aperture angle; a numerical aperture of an illumination optical system, and so on, by the illumination lens 403, the illumination aperture 404, the mirror 405, and the condenser lens 406, and enters the reticle 407. Diffracted light generated from a pattern of the reticle 407 reaches the substrate 11 according to the projection lens 408 (the numerical aperture of a projection optical system), and forms a photoresist pattern.

In general, a resolution R in the photolithography technique employing the stepper 400 as shown in FIG. 3 is represented by Rayleigh Equation (1) as below.

$$R = k^* \lambda / NA \qquad \text{Equation (1)}$$

Here, $\lambda$ denotes a wavelength of a laser output from the optical source 401, NA denotes the numerical aperture of a lens, and k denotes a constant number that is specified by the development process characteristics (process coefficient). According to this Equation (1), the resolution R is determined by the process coefficient k or the numerical aperture NA of lens, when the wavelength $\lambda$ is constant.

Meanwhile, coherence factor $\sigma$ is represented by Equation (2) as below.

$$\sigma = NA1/NA2 \qquad \text{Equation (2)}$$

Here, NA1 denotes the numerical aperture of the illumination optical system employed for the illumination lens 403, NA2 denotes the numerical aperture of the projection optical system employed for the projection lens 408, and the coherence factor $\sigma$ denotes the aperture of the illumination aperture 404.

The coherence factor $\sigma$ indicates the degree of the coherence of projection light. For example, $\sigma=0$ represents a complete coherence (plane waves perpendicularly entering a reticle), and $\sigma=1$ represents incoherent light entering from any angle within a range of a lens numerical aperture (NA) The magnitude of the coherence factor $\sigma$ results in a difference of diffracted light beams captured by a lens. With a large coherence factor $\sigma$, a higher-order diffracted light beam is captured by a lens, contributing to image formation, and thus pattern fidelity is enhanced. On the other hand, with a small coherence factor $\sigma$, a higher-order diffracted light beam does not enter a lens, leading to a further lack of information, and thus pattern fidelity decreases.

According to the present embodiment, illumination conditions are set such that the coherence factor $\sigma$ is a value smaller than one with respect to a pattern of which a square in which one side is 500 nm is drawn on the reticle 407. More specifically, the photoresist mask 6 is formed by an exposure process with the coherence factor $\sigma$ being 0.82, using the optical source 401 with KrF (krypton fluoride) and the stepper 400 with the NA of the projection optical system being 0.55.

FIG. 7A shows a SEM image of the shape of the photoresist mask 6 formed in a predetermined pattern, in the process shown in FIG. 2C, by an exposure process with the coherence factor $\sigma$ being 0.82, which is observed from above the substrate 11. A horizontal width 6a of the photoresist mask 6 is 497 nm, and a diagonal width 6b in the direction inclined at an angle of 45 degrees with respect to the horizontal width is 564 nm. Compared to the square drawn on the reticle, the photoresist mask 6 has a rounded shape in planar view, with receding corner portions. As described above, the photoresist mask 6 (FIG. 2C) is formed, which has a shape in which information of four corner portions of the square drawn on the reticle 407 is absent and the four corner portions recede toward the center of the pattern.

As described above, it is possible to form the photoresist mask 6 having a shape in planar view with four corner portions of the square receding toward the center of the pattern (center portion side), by performing the photolithography using the stepper 400 illustrated in FIG. 3 with the coherence factor $\sigma$ being set to a desired small value.

It is to be noted that, when a rectangular shape is drawn on the reticle, it is preferable that the coherence factor $\sigma$ is set to be smaller than 0.5 at the time of performing the photolithography during the projection on an exposure subject region, and that the corner portions of the photoresist mask in planar view recede toward the center portion of the photoresist mask.

Figure 5A:
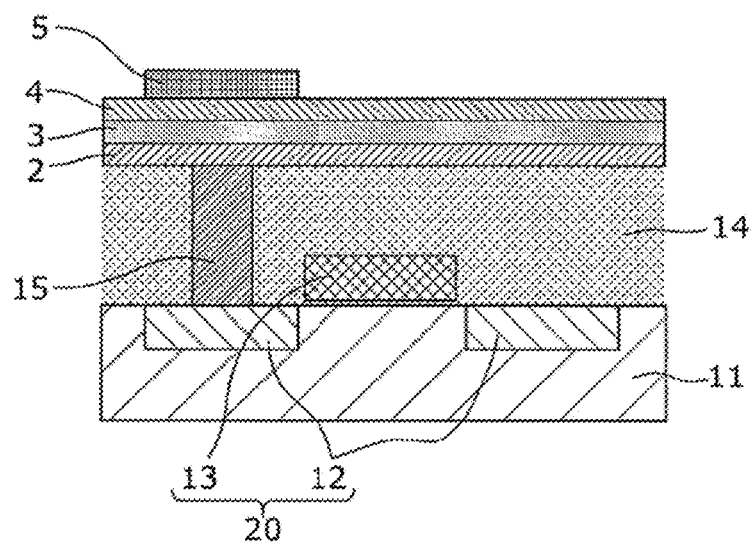
FIG. 5A is a cross-sectional diagram which shows a process (subsequent) of the manufacturing method for the nonvolatile memory device according to an embodiment of the present invention.

Next, in the process shown in FIG. 5A, pattern formation of the hard mask layer 5 is performed by a dry etching process using the photoresist mask 6 illustrated in FIG. 2C, thereby forming a hard mask 5'. As described above, the photoresist mask 6 used in this process is the photoresist mask 6 having the rounded shape in planar view with the corner portions receding toward the center portion as stated in the description for the step shown in FIG. 2C, and thus the hard mask 5' also has a rounded shape in planar view with the corner portions receding toward the center portion.

Next, in the process shown in FIG. 5B, etching is performed though a dry etching process collectively on the upper electrode layer 4, the variable resistance layer 3, and the lower electrode layer 2, using the hard mask 5', and subsequently, the hard mask 5' is removed. Through the processes described above, the nonvolatile memory element 1 is formed which includes the upper electrode layer 4, the variable resistance layer 3, and the lower electrode layer 2. In this process, the hard mask 5' used for the dry etching has the rounded shape in planar view with the corner portions receding toward the center portion, and thus the incident angles of plasma with respect to the etching edge surfaces of the upper electrode layer 4, the variable resistance layer 3, and the lower electrode layer 2 are as shown in FIGS. 16B and 16C. More specifically, the broadness (non-uniformity) of the incident angle range of plasma used for etching on the variable resistance layer 3 is reduced, and therefore the non-uniformity in the difference of the etching amount of the variable resistance layer 3 is reduced.

In addition, the hard mask 5' may not be removed but be held. When the hard mask 5' is not removed but held, the second contact plug 16 is formed to penetrate through the hard mask 5' as well to be connected to the upper electrode layer 4 in the process of forming the second contact plug 16 as will be described below. When the hard mask 5' is a conductive material, it is sufficient that the second contact plug 16 is simply connected to the hard mask 5' without penetrating through the hard mask 5'.

Figure 5B:
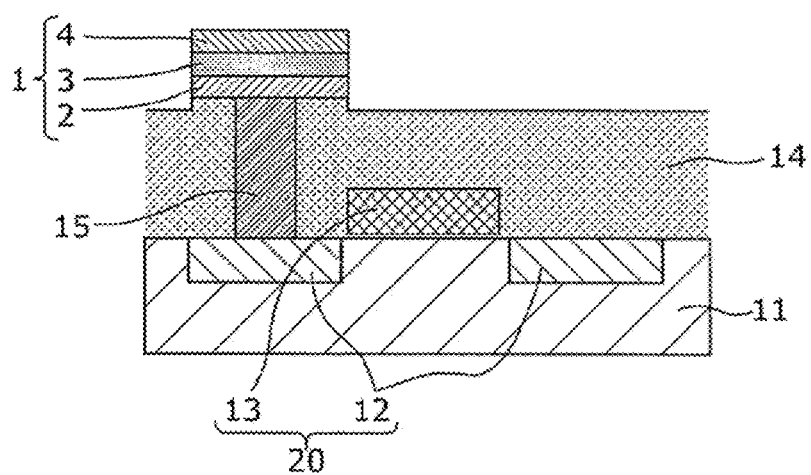
FIG. 5B is a cross-sectional diagram which shows a process (subsequent) of the manufacturing method for the nonvolatile memory device according to an embodiment of the present invention.

(a) in FIG. 7B shows a SEM image observed from above the substrate 11 and representing the nonvolatile memory element 1 formed in a predetermined pattern, using the photoresist mask 6 shown in FIG. 7A, in the process shown in FIG. 5B. The SEM image shows the upper electrode layer 4, the variable resistance layer 3, and the lower electrode layer 2. Each portion shown in (a) in FIG. 7B shows a corresponding one of the layers of the nonvolatile memory element 1 which is formed in the etching process in FIG. 5B and shown in (b) in FIG. 7B that is viewed from the cross-sectional direction.

When viewed from above the substrate, the nonvolatile memory element 1 has the horizontal width 3a of 398 nm and the diagonal width 3b of 432 nm in the direction inclined at an angle of 45 degrees with respect to the horizontal width, at the boundary between the upper electrode layer 4 and the variable resistance layer 3. The difference in size in the direction of the horizontal width between the photoresist mask 6 and the boundary of the upper electrode layer 4 and the variable resistance layer 3 (=(the horizontal width 6a of the photoresist mask)−(the horizontal width 3a at the boundary between the upper electrode layer 4 and the variable resistance layer 3)) is 99 nm. Meanwhile, the difference in size in the direction of the diagonal width between the photoresist mask 6 and the boundary of the upper electrode layer 4 and the variable resistance layer 3 (=(the diagonal width 6b of the photoresist mask)−(the diagonal width 3b at the boundary between the upper electrode layer 4 and the variable resistance layer 3)) is 132 nm. Thus, the difference in the amount of changes in size as a result of the dry etching process is 33 nm.

FIG. 8A shows a SEM image of the shape of the photoresist mask 6 formed in a predetermined pattern, in the process shown in FIG. 2C, with a smaller coherence factor σ being 0.47, which is observed from above the substrate 11. The horizontal width 6a of the photoresist mask 6 is 513 nm, and the diagonal width 6b in the direction inclined at an angle of 45 degrees with respect to the horizontal width is 543 nm. Compared to the shape drawn on the reticle 407, the photoresist mask 6 has a rounded shape in planar view with the corner portions further receding toward the center portion.

(a) in FIG. 8B shows a SEM image observed from above the substrate 11 and representing the nonvolatile memory element 1 formed into a predetermined pattern in the process shown in FIG. 5B using the photoresist mask 6 shown in FIG. 8A, by performing the dry etching process on the upper electrode layer 4, the variable resistance layer 3, and the lower electrode layer 2, using a mixed gas (etching gas) containing chlorine ($Cl_2$), argon (Ar), and oxygen ($O_2$) as the oxygen deficiency-suppressing gas, and then etching away the hard mask layer 5. The SEM image shows the upper electrode layer 4, the variable resistance layer 3, and the lower electrode layer 2. Each portion shown in (a) in FIG. 8B shows a corresponding one of the layers of the nonvolatile memory element 1 shown in (b) in FIG. 8B which is formed by the etching process shown in FIG. 5B and viewed from the cross-sectional direction.

It is to be noted that, the oxygen deficiency-suppressing gas contained in the etching gas is not limited to oxygen ($O_2$), and may be a hydrobromic (HBr) gas or a trifluoromethane ($CHF_3$) gas which easily adhere to the etching edge surface of the variable resistance layer 3.

When viewed from above the substrate, the nonvolatile memory element 1 has the horizontal width 3a of 398 nm and the diagonal width 3b of 419 nm in the direction inclined at an angle of 45 degrees with respect to the horizontal width, at the boundary between the upper electrode layer 4 and the variable resistance layer 3. The difference in size in the direction of the horizontal width between the photoresist mask 6 and the boundary of the upper electrode layer 4 and the variable resistance layer 3 (=(the horizontal width 6a of the photoresist mask)−(the horizontal width 3a at the boundary between the upper electrode layer 4 and the variable resistance layer 3)) is 115 nm. Meanwhile, the difference in size in the direction of the diagonal width between the photoresist mask 6 and the boundary of the upper electrode layer 4 and the variable resistance layer 3 (=(the diagonal width 6b of the photoresist mask)−(the diagonal width 3b at the boundary between the upper electrode layer 4 and the variable resistance layer 3)) is 124 nm. Thus, the difference in the amount of changes in size as a result of the dry etching process is 9 nm. It can be seen that, since the difference in the amount of changes in size is 9 nm, the difference is sufficiently reduced compared to the case of FIG. 7A and FIG. 7B, in which the difference in the amount of changes in size is 33 nm. Thus, the photoresist mask 6 is formed using a smaller coherence factor σ during the photolithography process, and the nonvolatile memory element 1 is formed through the above-described processes, thereby further reducing the difference (the difference in size from the size of the photoresist mask) in etching amounts on the etching edge surface of the variable resistance layer.

Figure 5C:
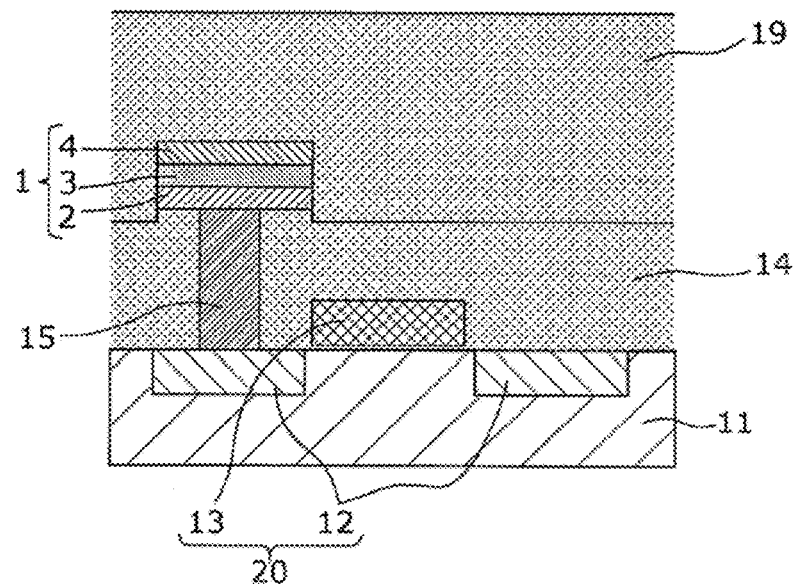
FIG. 5C is a cross-sectional diagram which shows a process (subsequent) of the manufacturing method for the nonvolatile memory device according to an embodiment of the present invention.

Next, in the process shown in FIG. 5C, the second interlayer insulating layer 19 is deposited to cover the first interlayer insulating layer 14, the upper electrode layer 4, the variable resistance layer 3, and the lower electrode layer 2, and then the second interlayer insulating layer 19 is planarized by performing the CMP planarization process.

Figure 6A:
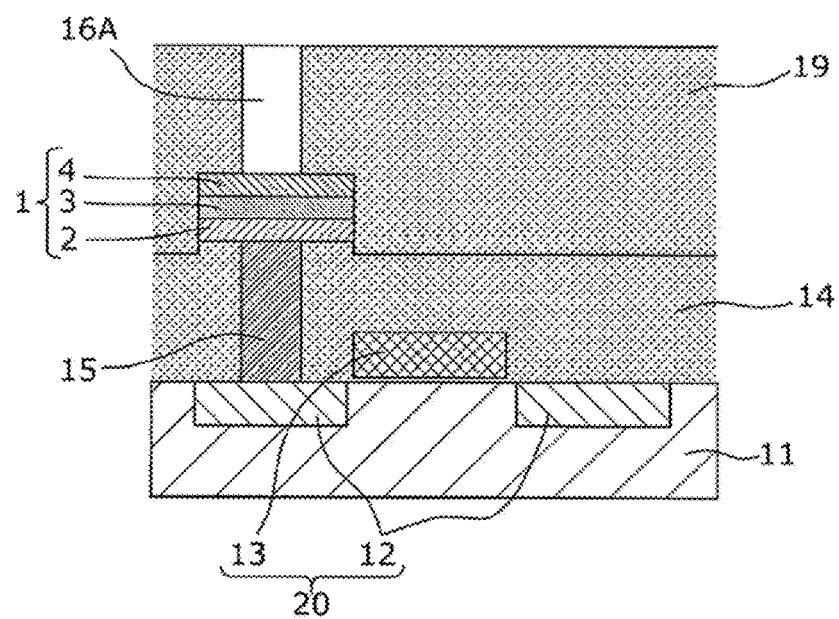
FIG. 6A is a cross-sectional diagram which shows a process (subsequent) of the manufacturing method for the nonvolatile memory device according to an embodiment of the present invention.

Next, in the process shown in FIG. 6A, a second contact plug opening 16A is formed so as to penetrate through the second interlayer insulating layer 19 to the upper electrode layer 4, at a predetermined position in which the second contact plug 16 is formed so as to be connected to the upper electrode layer 4 of the nonvolatile memory element 1.

Figure 6B:
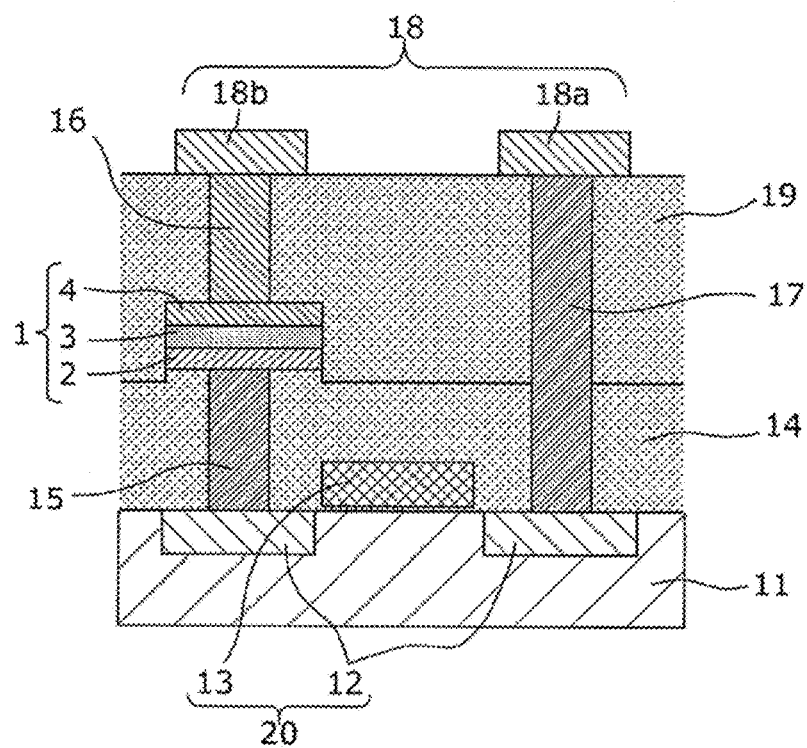
FIG. 6B is a cross-sectional diagram which shows a process (subsequent) of the manufacturing method for the nonvolatile memory device according to an embodiment of the present invention.

Next, in the process shown in FIG. 6B, the second contact plug 16 is formed in the second contact plug opening 16A by the filling formation process, and a third contact plug 17 for connection to one of the source and drain layers 12 is formed by the filling formation process to penetrate through the second interlayer insulating layer 19 and the first interlayer insulating layer 14. Tungsten may be used, for example, for the second contact plug 16 and the third contact plug 17. Next, the second line layer 18b to be connected to the second contact plug 16 and the first line layer 18a to be connected to the third contact plug 17 are formed on the upper surface of the second interlayer insulating layer 19.

As described above, the method of manufacturing a nonvolatile memory element having variable resistance according to this embodiment includes: forming a lower electrode layer 2 above a substrate 11 (FIG. 2B); forming a variable resistance layer 3 comprising a transition metal oxide on the lower electrode layer 2 (FIG. 2B); forming an upper electrode layer 4 on the variable resistance layer 3 (FIG. 2B); forming a hard mask layer 5 on the upper electrode layer 4 (FIG. 2B); forming a photoresist mask 6 on the hard mask layer 5 (FIG. 2C); forming a hard mask 5' by performing etching on the hard mask layer, using the photoresist mask 6 (FIG. 5A); and forming a nonvolatile memory element 1 including the upper electrode layer 4, the variable resistance layer 3, and the lower electrode layer 2, by performing etching, using the hard mask 5', on the upper electrode layer 4, the variable resistance layer 3, and the lower electrode layer 2, with an etching gas that contains an oxygen deficiency-suppressing gas (FIG. 5B). Here, when the variable resistance layer 3 has a resistance value which changes according to change in oxygen content and the etching gas does not contain the oxygen deficiency-suppressing gas, the oxygen content of the etched variable resistance layer 3 changes. In addition, in the forming of a nonvolatile memory element 1 (FIG. 5B), a component (bromine compound) included in the oxygen deficiency-suppressing gas adheres to sides of the variable resistance layer 3 as a result of the etching using the etching gas that contains the oxygen deficiency-suppressing gas. In the forming of a photoresist mask 6 (FIG. 2C), the photoresist mask 6 is formed to have corner portions in planar view, the corner portions receding toward a center portion of the photoresist mask 6.

Though the processes described above, it is possible to manufacture the nonvolatile memory device 10 illustrated in FIG. 1, which is the nonvolatile memory device 10 of the 1T1R type (one transistor and one variable resistance nonvolatile element) including one transistor 20 and one nonvolatile memory element 1.

The nonvolatile memory element 1 that is manufactured as described above has a feature below. That is, the nonvolatile memory element 1 includes: a lower electrode layer 2 formed above a substrate 11; a variable resistance layer 3 which comprises a transition metal oxide and is formed on the lower electrode layer 2; and an upper electrode layer 4 formed on the variable resistance layer 3, Each of the upper electrode layer 4, the variable resistance layer 3, and the lower electrode layer 2 has corner portions receding toward a center portion in planar view. The variable resistance layer 3 has sides to which a component (bromine, bromine compound) included in an oxygen deficiency-suppressing gas adheres, the oxygen deficiency-suppressing gas being contained in an etching gas used in forming of the upper electrode layer 4, the variable resistance layer 3, and the lower electrode layer 2.

It is to be noted that the bromine compound that adheres to the sides of the variable resistance layer 3 due to the oxygen deficiency-suppressing gas is detected as below.

FIG. 9 shows the amount of elements which are obtained by analyzing the surface of $TaO_x$ used for the nonvolatile storage element 1, by performing an X-ray photoelectron spectroscopy (XPS) analysis. The diagram shows: a result of Ir4f spectrum analysis performed on the surface of $TaO_x$ on which etching is performed using the mixed gas that contains the bromine compound, as an example of the present embodiment; and a result of Ir4f spectrum analysis performed on the surface of $TaO_x$ on which etching is performed using a mixed gas that does not contain the bromine compound, as a comparison example. It is to be noted that the conditions for the XPS analysis here are set as follows: 150 eV for an incident energy; 100 eV for a pass energy; 0.1 eV for an energy step; 0.2 ms/step for an acquisition time, and 25 times for the number of times of integrations, VG Scienta R4000Wal is employed as a detector.

In the example of the present embodiment, a bromine compound product (IrBrx) is detected on the surface of the $TaO_x$ used for the nonvolatile memory element 1 at 62 eV and 65 eV. On the other hand, in the comparison example, the bromine compound product is not detected on the surface of the $TaO_x$ used for the variable resistance element.

Although 100 or more malfunctioning bits were found in a nonvolatile memory element array having 256 kilobits and formed by the etching method without an oxygen deficiency-suppressing gas, no malfunctioning bit was found in a nonvolatile memory element array according to the present embodiment which has 256 kilobits and is formed such that a component included in the oxygen deficiency-suppressing gas adheres to the sides of the variable resistance layer.

This shows that, when etching is performed on the nonvolatile memory element 1 using the mixed gas containing bromine, the bromine compound product is caused to form (adhesion) on the etching edge surface, thereby preventing entrance of etch damages such as oxygen dissociation and doping with impurities.

FIG. 10 shows a resistivity distribution of the nonvolatile memory device 10 manufactured under the conditions of each of FIG. 7A and FIG. 7B, and FIG. 8A and FIG. 8B, more specifically, a resistivity distribution of initial resistance values of the nonvolatile memory element 1 formed in a predetermined pattern, by performing etching, using the photoresist mask 6, on the variable resistance layer 3 through the dry etching process with a mixed gas (etching gas) containing hydrobromic (HBr) or trifluoromethane ($CHF_3$) as a protection gas that easily adheres to the etching edge surface, and then etching away the hard mask layer 5, in the process shown in FIG. 5B. This diagram shows a resistivity distribution of the initial resistance values of a number of nonvolatile memory elements 1 manufactured under the conditions in which the coherence factor σ is 0.82 (plotted by black circles) and a resistivity distribution of the initial resistance values of a number of nonvolatile memory elements 1 manufactured under the conditions in which the coherence factor σ is 0.47 (plotted by white triangles). In FIG. 10, the horizontal axis indicates the initial resistance values and the vertical axis indicates normal anticipated values.

As can be seen from FIG. 10, variation in the initial resistance value is reduced when the coherence factor σ is 0.47 from when the coherence factor σ is 0.82. This is attributed to the fact that the rounded planer shape of the photoresist mask 6 when the coherence factor σ is 0.47 has the corner portions further receding toward the center portion than the rounded planer shape of the photoresist mask 6 when the coherence factor σ is 0.82, and since the difference in the amount of changes in size due to dry etching is 33 nm when the coherence factor σ is 0.82 as opposed to 9 nm when the coherence factor σ is 0.47, the effect of the oxygen deficiency-suppressing gas increases (the effect of preventing the oxygen defect on the etching edge surface is uniformed), and thus the non-uniformity of etch damage applied to the nonvolatile memory element 1 is reduced by setting the coherence factor σ as being smaller. In sum, it is possible to further reduce the variation in the initial resistance values of the nonvolatile memory device 10 by setting the coherence factor σ further smaller.

In addition, since the oxygen defect in the sides (etching edge surface) is reduced by the oxygen deficiency-suppressing gas contained in the etching gas, the variation in the initial resistance values of the nonvolatile memory element 1 is further reduced.

Accordingly, when manufacturing the nonvolatile memory element using a conventional rectangle reticle, it is possible to further reduce the variation in the initial resistance values of a nonvolatile memory element, by manufacturing the nonvolatile memory element using a photoresist mask having a rounded planer shape with the coherence factor σ being smaller and the corner portions further receding toward the center portion, to equalize the etching amount on the etching edge surface and increase the effect of the oxygen deficiency-suppressing gas.

FIG. 11A is a graph which shows a result of an experiment for confirming an effect of the shapes of the photoresist mask in planar view and an effect of the oxygen deficiency-suppressing gas to be contained in the etching gas. The vertical axis and the horizontal axis in FIG. 11A are the same as the vertical axis and the horizontal axis in FIG. 10. FIG. 11B is a diagram which shows variation in the initial resistance values (the vertical axis, σ%, values (%) obtained by dividing a standard deviation a of the distribution by an average value of the distribution) in the experiment shown in FIG. 11A under the respective conditions (horizontal axis). In addition, schematic diagrams of the shapes of the photoresist masks in planar view are shown in the frame right above in FIG. 11B, which indicate that the "rounded shape (ii)" has corner portions further receding toward the center portion than the "rounded shape (i)" does.

Here, the circle plots in FIG. 11A represent the resistivity distribution of the initial resistance values of the nonvolatile memory element 1 manufactured using a photoresist mask having round corner portions (the "rounded shape (ii)" in FIG. 11B) and an oxygen gas as the oxygen deficiency-suppressing gas to be contained in the etching gas. The X plots in FIG. 11A represent the resistivity distribution of the initial resistance values of the nonvolatile memory element 1 manufactured using a photoresist mask having a rounded shape (the "rounded shape (ii)" in FIG. 11B) and an oxygen gas as the oxygen deficiency-suppressing gas to be contained in the etching gas. The triangle plots in FIG. 11A represent the resistivity distribution of the initial resistance values of the nonvolatile memory element 1 manufactured using the photoresist mask having a rounded shape (the "rounded shape (ii)" in FIG. 11B) and hydrobromic HBr as the oxygen deficiency-suppressing gas to be contained in the etching gas. The square plots in FIG. 11A represent the resistivity distribution of the initial resistance values of the nonvolatile memory element 1 manufactured using the photoresist mask having a rounded shape (the "rounded shape (ii)" in FIG. 11B) and a trifluoromethane $CHF_3$ as the oxygen deficiency-suppressing gas to be included in the etching gas.

FIG. 11B is a diagram for comparing the variation in the initial resistance values for each sample shown in FIG. 11A. The sample of which the photoresist mask having the rounded shape (i) is used and the etching gas containing the oxygen gas is used indicates the variation in the initial resistance values of 44.4%. The sample of which the photoresist mask having the rounded shape (ii) is used and the etching gas containing the oxygen gas is used indicates the variation in the initial resistance values of 25.4% The sample of which the photoresist mask having the rounded shape (ii) is used and the etching gas containing the hydrobromic HBr as the protection gas is used indicates the variation in the initial resistance values of 13.4%. The sample of which the photoresist mask having the rounded shape (ii) is used and the etching gas containing the trifluoromethane $CHF_3$ as the protection gas is used indicates the variation in the initial resistance values of 16.5%.

As can be seen from FIG. 11B, the variation in the initial resistance values of the nonvolatile memory element 1 is smaller when the nonvolatile memory element 1 is manufactured using a photoresist mask which has a circular form than using a photoresist mask having the rounded corner portions. Meanwhile, the variation in the initial resistance values of the nonvolatile memory element 1 is smaller when the nonvolatile memory element 1 is manufactured using an etching gas containing the hydrobromic HBr or the trifluoromethane ago $CHF_3$ than an etching gas containing oxygen, as the oxygen deficiency-suppressing gas to be contained in the etching gas.

With the nonvolatile memory element and the method of manufacturing the nonvolatile memory element according to the present embodiment described above, since a hard mask is formed using the photoresist mask having a shape with the corner portions receding toward the center portion in planar view, and further the hard mask is used to form the nonvolatile memory element, the nonvolatile memory element has a shape without a corner portion having an angle of 90 degree in planar view, and thus the non-uniformity in the etching amount of the variable resistance layer is reduced. In addition, when the etching gas contains the oxygen deficiency-suppressing gas, the effect of reducing change in the oxygen content of the variable resistance layer at the etching edge surface is increased. Therefore, the non-uniformity in etch damage to the variable resistance layer is reduced, the variation in the resistance values of the nonvolatile memory element is reduced, and thus a high-quality nonvolatile memory element is implemented without variation in an initial operation pertinent to the resistance values and operational characteristics.

As described above, with the manufacturing method according to the present embodiment, it is possible to manufacture the nonvolatile memory element 1 with the variation in the resistance values being reduced, and employment of the nonvolatile memory element 1 in a 1T1R nonvolatile memory device, for example, enables implementation of the nonvolatile memory device with a stable operation.

Figure 4A:
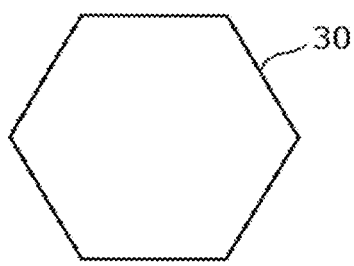
FIG. 4A is a diagram which shows an example of a shape drawn on a reticle according to an embodiment of the present invention.
Figure 4B:
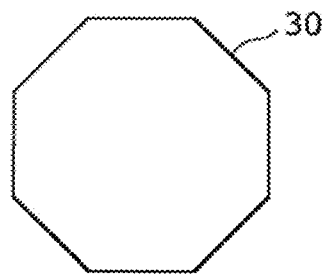
FIG. 4B is a diagram which shows another example of a shape drawn on a reticle according to an embodiment of the present invention.

It is to be noted that, in the above-described embodiments, an example is used in the process shown in FIG. 2C in which a pattern of which square is drawn on the reticle is used at the time of photolithography, however, as the pattern to be drawn on the reticle, a pattern 30 as shown in FIG. 4A and FIG. 4B may be used which has a hexagonal shape or an octagon shape each of which has two adjacent edge surfaces (in other word, adjacent side surfaces, that is, adjacent outer lines) that form an angle larger than 90 degrees. Alternatively, when the pattern 30 of which a curved shape having no square corner (a rectangle with round corners or a circle) is drawn on the reticle is used, it is possible to form the photoresist mask 6 accurately and faithfully by setting the coherence factor σ to one, and thus it is also possible to form the photoresist mask 6 having a rounded shape in planar view with the corner portions receding toward the center portion as stated in the above-described embodiments, thereby allowing the same advantageous effect as the advantageous effect of the above-described embodiments to be obtained.

Figure 4C:
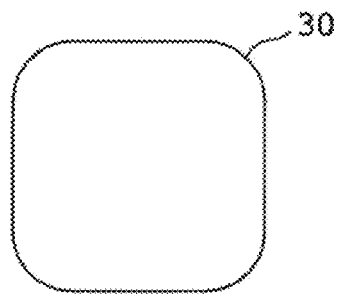
FIG. 4C is a diagram which shows yet another example of a shape drawn on a reticle according to an embodiment of the present invention.

It is to be noted that various expressions can be used for the shape of the reticle in planar view as shown in FIG. 4A to FIG. 4C. More specifically, when the reticle has a polygonal shape in planar view, it is sufficient that two adjacent outer lines in each of the corner portions form an angle larger than 90 degrees, or have a rounded shape. In addition, the reticle may has a shape in planar view which is surrounded by a curve, such as a circle or an oval. In addition, the reticle may have a shape in planar view which has a rounded corner portion having an angle lager than 90 degrees which is formed by two outer lines, which is mixed with a portion surrounded by a curve. These types of the shape of the reticle in planar view can be applied as it is to the pattern shape of the photoresist mask used when manufacturing the nonvolatile memory element according to the present invention.

The nonvolatile memory element and method of manufacturing the nonvolatile memory element according to the present invention are described above, however, the present invention is not limited to the embodiments above. Other forms in which various modifications of the embodiments apparent to those skilled in the art, or forms structured by combining elements of different embodiments and characteristic portions are included are included within the scope of the present invention.

For example, although (1) the method of setting a coherence factor less than one at the time of photolithography and (2) the method of using a reticle on which a shape with adjacent edge surfaces forming an angle larger than 90 degrees are described as the methods of forming a photoresist mask having a shape in planar view with the corner portions receding toward the center portion, these two methods may be employed in combination, in addition to exclusively selecting one of these methods.

In addition, the present invention can be implemented not only as a nonvolatile memory element and a manufacturing method thereof but also as a nonvolatile memory element including peripheral structural elements and a manufacturing method thereof.

INDUSTRIAL APPLICABILITY

The nonvolatile memory element according to the present invention is useful in application of a nonvolatile memory element used in a variety of electronic devices such as digital home appliances, memory cards, mobile phones, and personal computers.

The method of manufacturing a nonvolatile memory element according to the present invention is useful as a method of manufacturing a nonvolatile memory element which can be used in a variety of electronic devices such as digital home appliances, memory cards, mobile phones, and personal computers.

REFERENCE SIGNS LIST 1 nonvolatile memory element
2 lower electrode layer
3 variable resistance layer
3a horizontal width at the boundary between the upper electrode layer and the variable resistance layer
3b diagonal width at the boundary between the upper electrode layer and the variable resistance layer
4 upper electrode layer
5 hard mask layer
5' hard mask
6 photoresist mask
6a horizontal width of the photoresist mask
6b diagonal width of the photoresist mask
10 nonvolatile memory device
11 substrate
12 source and drain layers
13 gate layer
14 first interlayer insulating layer
15 first contact plug
16 second contact plug
16A second contact plug opening
17 third contact plug
18 line layer
18a first line layer
18b second line layer
19 second interlayer insulating layer
20 transistor
30 pattern (shape drawn on a reticle)
300 etching subject
301 etching edge surface in a corner portion
302 etching edge surface in a curved portion
302 etching edge surface in a linear portion
400 stepper
401 optical source
402, 405 mirrors
403 illumination lens
404 illumination aperture
406 condenser lens
407 reticle
408 projection lens

The invention claimed is:

1. A method of manufacturing a nonvolatile memory element having variable resistance, the method comprising:
    forming a lower electrode layer above a substrate;
    forming a variable resistance layer on the lower electrode layer, the variable resistance layer comprising an oxygen-deficient transition metal oxide;
    forming an upper electrode layer on the variable resistance layer;
    forming a hard mask layer on the upper electrode layer;
    forming a photoresist mask on the hard mask layer, the photoresist mask having a rounded shape in planar view;
    forming a hard mask by performing etching on the hard mask layer, using the photoresist mask; and
    forming a nonvolatile memory element including the upper electrode layer, the variable resistance layer, and the lower electrode layer, by performing etching, using the hard mask, on the upper electrode layer, the variable resistance layer, and the lower electrode layer, with an etching gas that contains an oxygen deficiency-suppressing gas, the nonvolatile memory element having a rounded shape in planar view.

2. The method of manufacturing a nonvolatile memory element according to claim 1,
    wherein in the forming of a photoresist mask, the photoresist mask is formed by projecting, on an exposure subject region, a rectangular shape drawn on a reticle, with a coherence factor during photolithography being smaller than one.

3. The method of manufacturing a nonvolatile memory element according to claim 1,
    wherein in the forming of a photoresist mask, the photoresist mask is formed by projecting, on an exposure subject region, a rectangular shape drawn on a reticle, with a coherence factor during photolithography being smaller than 0.5.

4. The method of manufacturing a nonvolatile memory element according to claim 1,
    wherein in the forming of a photoresist mask, the photoresist mask is formed by performing photolithography using a reticle on which a shape is drawn, the shape having an angle larger than 90 degrees formed by two adjacent edge surfaces.

5. The method of manufacturing a nonvolatile memory element according to claim 1,
    wherein in the forming of a variable resistance layer, the variable resistance layer is formed using a tantalum oxide $TaO_x$ where $0<x<2.5$.

6. The method of manufacturing a nonvolatile memory element according to claim 1,
    wherein in the forming of an upper electrode layer, the upper electrode layer is formed using any one of platinum, iridium, and palladium.

7. The method of manufacturing a nonvolatile memory element according to claim 1,
    wherein in the forming of a hard mask layer, the hard mask layer is formed using aluminum titanium nitride.

8. The method of manufacturing a nonvolatile memory element according to claim 1,
    wherein in the forming of a nonvolatile memory element, the oxygen deficiency-suppressing gas reduces change in oxygen content on an etching edge surface of the variable resistance layer.

9. The method of manufacturing a nonvolatile memory element according to claim 1,
    wherein in the forming of a nonvolatile memory element, the nonvolatile memory element is formed to have sides to which a component included in the oxygen deficiency-suppressing gas adheres as a result of the etching using the etching gas that contains the oxygen deficiency-suppressing gas.

10. The method of manufacturing a nonvolatile memory element according to claim 1,
wherein in the forming of a photoresist mask, the photoresist mask is formed to have corner portions in planar view, the corner portions receding toward a center portion of the photoresist mask relative to a corner portion having an angle of 90 degrees.

11. The method of manufacturing a nonvolatile memory element according to claim 1,
wherein, when the variable resistance layer has a resistance value which changes according to change in oxygen content and the etching gas does not contain the oxygen deficiency-suppressing gas, the oxygen content of the etched variable resistance layer changes.

12. The method of manufacturing a nonvolatile memory element according to claim 1,
wherein the oxygen deficiency-suppressing gas contains a bromine compound.

13. The method of manufacturing a nonvolatile memory element according to claim 1,
wherein in the forming of a nonvolatile memory element, the nonvolatile memory element is formed by performing etching, using the etching gas that contains the oxygen deficiency-suppressing gas, while causing a component included in the oxygen deficiency-suppressing gas to adhere to sides of the variable resistance layer.

* * * * *